(12) United States Patent
Kim et al.

(10) Patent No.: US 9,372,401 B2
(45) Date of Patent: Jun. 21, 2016

(54) METHOD OF FORMING MICROPATTERNS

(75) Inventors: Ki-jeong Kim, Hwaseong-si (KR); Jae-ho Min, Yongin-si (KR); Kyoung-sub Shin, Seongnam-si (KR); Dong-hyun Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 457 days.

(21) Appl. No.: 13/588,011

(22) Filed: Aug. 17, 2012

(65) Prior Publication Data

US 2013/0048603 A1    Feb. 28, 2013

(30) Foreign Application Priority Data

Aug. 23, 2011    (KR) .................. 10-2011-0084059

(51) Int. Cl.
| | |
|---|---|
| *H01L 21/302* | (2006.01) |
| *H01L 21/461* | (2006.01) |
| *H01L 21/311* | (2006.01) |
| *C03C 15/00* | (2006.01) |
| *C03C 25/68* | (2006.01) |
| *C23F 1/00* | (2006.01) |
| *G03F 7/00* | (2006.01) |

(52) U.S. Cl.
CPC .............. *G03F 7/0035* (2013.01); *G03F 7/00* (2013.01)

(58) Field of Classification Search
None
See application file for complete search history.

(56) References Cited

U.S. PATENT DOCUMENTS

| | | | |
|---|---|---|---|
| 2008/0008969 A1 | 1/2008 | Zhou et al. | |
| 2010/0144153 A1 | 6/2010 | Sills et al. | |
| 2011/0151668 A1* | 6/2011 | Tang et al. | 438/671 |

FOREIGN PATENT DOCUMENTS

KR    10-2010-0049334 A    5/2010

* cited by examiner

*Primary Examiner* — Stephanie Duclair
(74) *Attorney, Agent, or Firm* — Lee & Morse, P.C.

(57) ABSTRACT

A method of forming micropatterns separated over a misalignment margin includes forming a first mold pattern including a main pattern and a separation-assist pattern, forming a first spacer mask having a first width around the first mold pattern, forming a second mold pattern using the first spacer mask as an etch mask, forming a second spacer mask having a second width around the second mold pattern, and forming a target pattern using the second spacer mask as an etch mask.

18 Claims, 32 Drawing Sheets

METHOD OF FORMING MICROPATTERNS

CROSS-REFERENCE TO RELATED APPLICATIONS

This application claims the benefit of Korean Patent Application No. 10-2011-0084059, filed on Aug. 23, 2011, in the Korean Intellectual Property Office, the disclosure of which is incorporated herein in its entirety by reference.

BACKGROUND

1. Field

The inventive concept relates to a method of forming micropatterns that are separated beyond a misalignment margin, and more particularly, to a method of forming micropatterns that are separated beyond a misalignment margin without an additional process.

2. Description of the Related Art

With a trend to manufacture thin and light electronic products, a demand for micropatterning a semiconductor device has been increased. Micropattern forming technologies such as a quadruple patterning technology (QPT) have been developed and studied. The QPT is an extension of a double patterning technology (DPT) and may produce finer patterns than the DPT. However, further studies are required in relation to other semiconductor manufacturing processes.

SUMMARY

The inventive concept provides a method of forming micropatterns with a sufficient misalignment margin with respect to a pad, even for extremely fine patterns, so contact between parallel wirings due to a reverse loading effect may b e reduced.

According to an aspect of the inventive concept, there is provided a method of forming micropatterns separated over a misalignment margin that includes forming a first mold pattern having a main pattern and a separation-assist pattern, forming a first spacer mask having a first width around the first mold pattern, forming a second mold pattern using the first spacer mask as an etch mask, forming a second spacer mask having a second width around the second mold pattern, and forming a target pattern using the second spacer mask as an etch mask.

The separation-assist pattern may include a recess pattern formed on the main pattern. In the separation-assist pattern that is the recess pattern, a width of the recess pattern may be about 1 F to about 3 F. The main pattern may include an extension portion extending in a first direction and an end portion connected to the extension portion and having a width larger than the extension portion, and the recess pattern may be formed at the end portion. The separation-assist pattern may include at least two recess patterns, and an interval between the recess patterns may be greater than or equal to 5 F.

The separation-assist pattern may include an auxiliary pattern formed adjacent to the main pattern. The interval between the main pattern and the auxiliary pattern may be about 1 F to about 3 F. The main pattern may include an extension portion extending in a first direction and an end portion having a width larger than the extension portion, and the auxiliary pattern may be formed adjacent to the end portion.

The method may further include trimming a portion of the second spacer mask before the forming of the target pattern. The trimming of a portion of the second spacer mask may include trimming a portion of the second spacer mask and the portion may be derived from the separation-assist pattern.

The method may further include forming a pad mask pattern that at least partially overlaps the second spacer mask, wherein at least one of trimmed end portions of the second spacer mask may be disposed at a distance of about 30 nm to about 70 nm from the pad mask pattern.

The method may further include trimming a portion of the second spacer mask, wherein a trimmed length of a second spacer mask derived from the separation-assist pattern may be different from a trimmed length of the second spacer mask derived from the main pattern. A distance between a trimmed end portion of the second spacer mask derived from the separation-assist pattern and a trimmed end portion of the second spacer mask derived from the main pattern may be greater than or equal to 5 F.

The separation-assist pattern may include a cavity pattern formed in the main pattern.

According to another aspect of the inventive concept, there is provided a method of forming micropatterns separated over a misalignment margin that includes forming a first mold pattern on a first material layer, the first mold pattern including a main pattern and a separation-assist pattern, and the separation-assist pattern being positioned to expose a space on the first material layer adjacent to the main pattern, forming a first spacer mask having a first width around the first mold pattern, forming a second mold pattern using the first spacer mask as an etch mask, forming a second spacer mask having a second width around the second mold pattern, and forming a target pattern using the second spacer mask as an etch mask.

The method may further include trimming a portion of the second spacer mask before forming the target pattern, such that the second spacer mask includes a plurality of separated micropatterns. The method may further include forming a pad mask pattern connected to one of the plurality of micropattern, the pad being positioned adjacent to the exposed space defined by the separation-assist pattern. Forming the exposed space defined by the separation-assist pattern may define a space between two adjacent micropatterns. Forming the first spacer mask around the first mold pattern may include forming the first spacer mask on all sidewalls of the first mold pattern, forming the second mold pattern may include removing the first material layer, with the exception of material directly below the first spacer mask, and forming the second spacer mask around the second mold pattern includes forming the second spacer mask on all sidewalls of the second mold pattern, the second mold pattern having a shape of the first spacer mask.

According to yet another aspect of the inventive concept, there is provided a method of forming micropatterns separated over a misalignment margin, which includes forming a first material layer on an etch target layer where a target pattern is to be formed, forming a first mold pattern including a main pattern and a separation-assist pattern and formed of a second material having an etch selectivity with respect to the first material layer and formed on the first material layer, forming a first spacer mask having a first width on a side wall of the first mold pattern, removing the first mold pattern, etching the first material layer using the first spacer mask as an etch mask, to form a second mold pattern, forming a second spacer mask on a side wall of the second mold pattern, removing the second mold pattern, and etching the etch target layer using the second spacer mask as an etch mask, to form a target pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
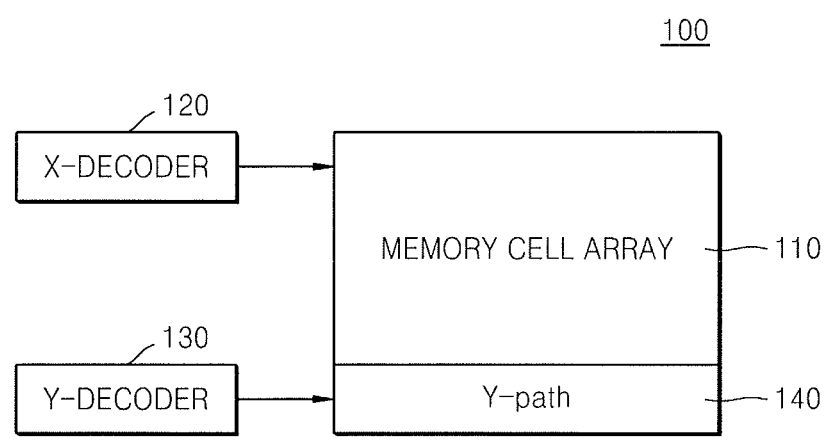
FIG. 1 illustrates a block diagram of a memory device according to an inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

The terms such as "first" and "second" are used herein merely to describe a variety of constituent elements, but the constituent elements are not limited by the terms. The terms are used only for the purpose of distinguishing one constituent element from another constituent element. For example, without departing from the right scope of the present inventive concept, a first constituent element may be referred to as a second constituent element, and vice versa.

In the drawing figures, the dimensions of layers and regions may be exaggerated for clarity of illustration. It will also be understood that when a constituent element "connects" or is "connected" to another constituent element, the constituent element contacts or is connected to the other constituent element directly or through at least one of other constituent elements. Conversely, when a constituent element is described to "directly connect" or to be "directly connected" to another constituent element, the constituent element should be construed to be directly connected to another constituent element without any other constituent element interposed therebetween. Other expressions, such as, "between" and "directly between" (or "on" and "directly on"), describing the relationship between the constituent elements, may be construed in the same manner.

The terms used in the present specification are used for explaining a specific exemplary embodiment, not limiting the present inventive concept. Thus, the expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those skilled in the art to which the present inventive concept may pertain. The terms as those defined in generally used dictionaries are construed to have meanings matching that in the context of related technology and, unless clearly defined otherwise, are not construed to be ideally or excessively formal.

As used herein, the term "and/or" includes any and all combinations of one or more of the associated listed items. Expressions such as "at least one of," when preceding a list of elements, modify the entire list of elements and do not modify the individual elements of the list.

Figure 2:
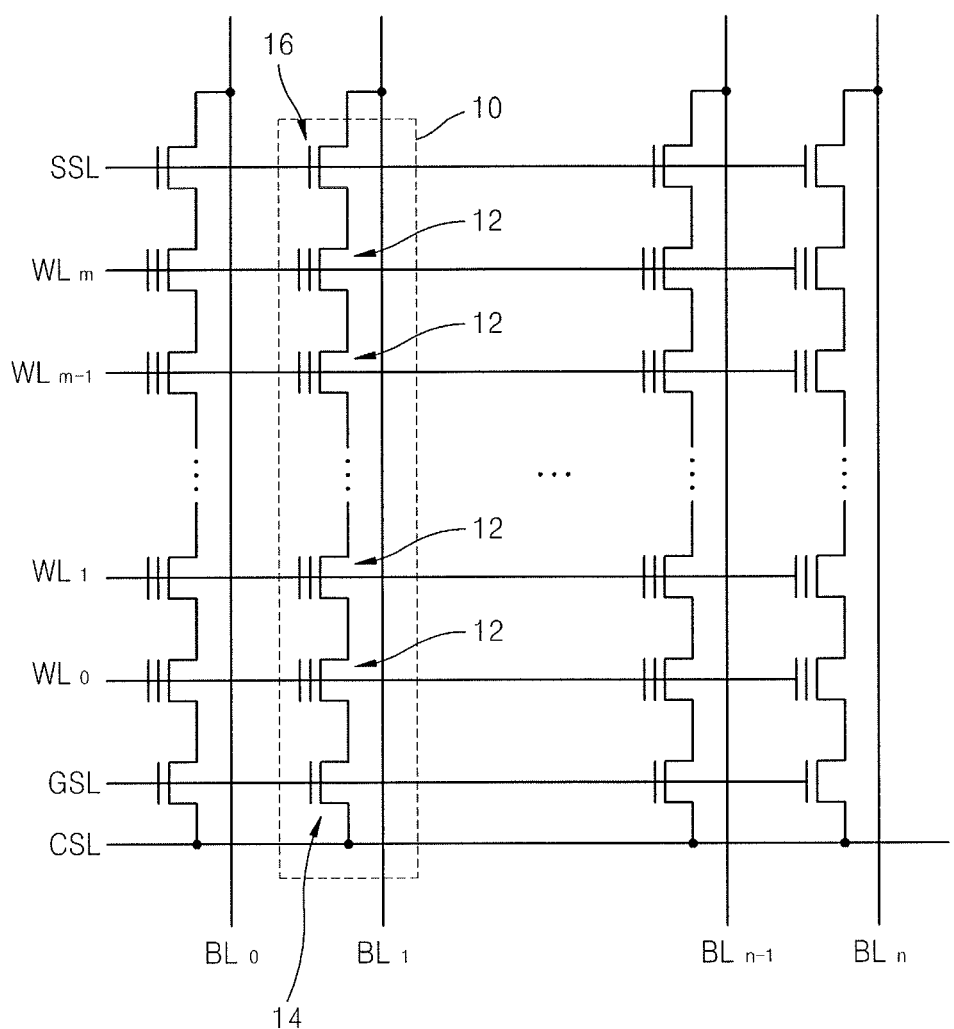
FIG. 2 illustrates a circuit diagram of a memory cell array in the memory device of FIG. 1.

FIG. 1 is a block diagram of a memory device 100 illustrating an application example of exemplary embodiments of the present inventive concept. Referring to FIG. 1, a memory cell array 110 includes memory units as illustrated in FIG. 2. An X-decoder 120 may be connected to word lines of the memory cell array 110. Also, a Y-decoder 130 may be connected to bit lines of the memory cell array 110 via a Y-path circuit 140.

The memory device 100 may be, e.g., DRAMs, SRAMs, NANDs, NORs, PRAMs, MRAMs, FeRAMs, etc. For convenience of explanation, a case of a NAND is described below.

FIG. 2 is a circuit diagram of the memory cell array 110 included in the memory device 100 of FIG. 1. Referring to FIGS. 1 and 2, the memory device 100, e.g., a NAND flash memory device, includes the memory cell array 110 formed of an array of memory cells arranged in high density structure. A peripheral circuit for accessing and driving the memory cell array 110 includes the X-decoder block 120 for selecting a word line WL, e.g., word lines $WL_0$, $WL_1$, ..., $WL_{m-1}$, $WL_m$, of the memory cell array 110 to be accessed, and the Y-decoder block 130 for selecting a bit line BL, e.g., bit lines $BL_0$, $BL_1$, ..., $BL_{n-1}$, $BL_n$, of the memory cell array 110 to be activated. The Y-path circuit 140 allots a bit line path based on an output of the Y-decoder block 130.

Referring to FIG. 2, a cell string 10 of the memory cell array 110 may include a plurality of memory cells 12 that are serially connected to each other. Gate electrodes of the memory cells 12 included in a single cell string 10 are connected to different word lines WL, e.g., word lines $WL_0$, $WL_1$, ..., $WL_{m-1}$, $WL_m$. A ground selection transistor 14 connected to a ground selection line (GSL) and a string selection transistor 16 connected to a string selection line (SSL) are arranged at both ends of the cell string 10. The ground selection transistor 14 and the string selection transistor 16 control electrical connection between the memory cells 12 and the bit lines $BL_0$, $BL_1$, ..., $BL_{n-1}$, $BL_n$ and a common source line CSL. The memory cells 12 connected to one of the word lines $WL_0$, $WL_1$, ..., $WL_{m-1}$, $WL_m$ across the cell strings 10 form a page unit or a byte unit.

To perform a read operation or a write operation by selecting a predetermined memory cell from the memory device 100 of FIG. 1, corresponding cells are selected by selecting the word lines $WL_0$, $WL_1$, ..., $WL_{m-1}$, $WL_m$ and the bit lines $BL_0$, $BL_1$, ..., $BL_{n-1}$, $BL_n$ of the memory cell array 110 by using the X-decoder block 120 and the Y-decoder block 130.

The NAND flash memory device has a relatively high degree of integration due to a structure in which a plurality of memory cells are serially connected. However, in order to shrink a chip size, there is a demand for further decrease in the design rule for the NAND flash memory device. Also, as the design rule decreases, the minimum pitch of patterns needed to form a NAND flash memory device is greatly reduced. In order to embody micropatterns according to the decreased design rule, the present inventive concept provides a method of forming separated micropatterns having an arrangement structure that is capable of securing a sufficient process margin while using a pattern having a size that may be realized within a resolution limit obtainable by exposure equipment and exposure technology provided by currently developed lithography technology.

FIGS. 3A-3I are plan views and side cross-sectional views of stages in a method of forming micropatterns and a pad using quadruple patterning technology (QPT). Each side cross-sectional view illustrates a cross section taken along line I-I' or II-II' of a corresponding plan view in a same figure.

Figure 3A:
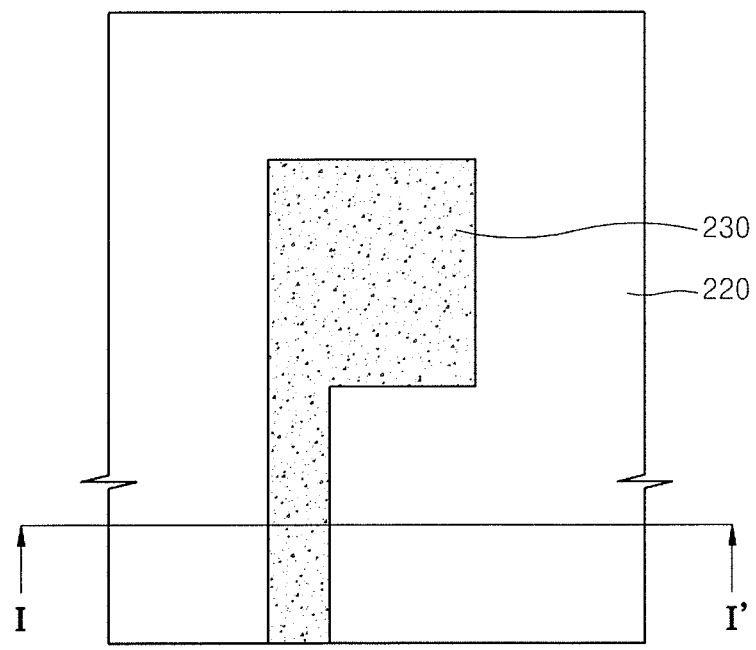
FIGS. 3A-3I illustrate plan views and side cross-sectional views of stages in a method of forming micropatterns and a pad using the QPT.
Figure 3A:
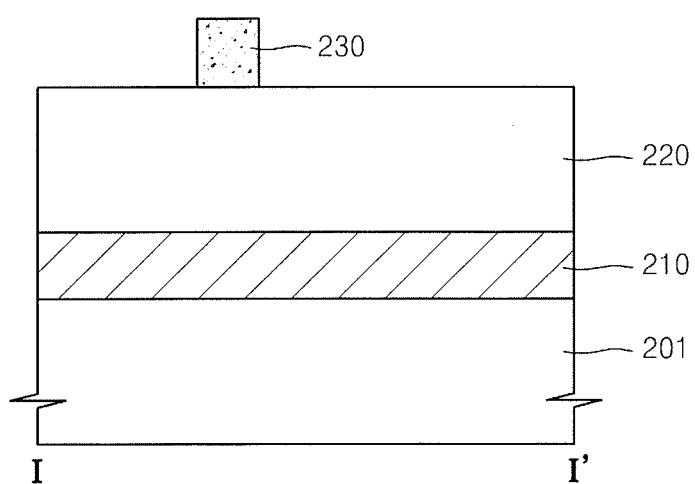

Referring to FIG. 3A, an etch target layer 210 may be provided on a substrate 201. The etch target layer 210 is a material layer for forming a target pattern. The substrate 201 and the etch target layer 210 may be formed of the same material or different materials. When the substrate 201 is formed of a material different from that of the etch target layer 210, the substrate 201 and the etch target layer 210 may have an identical or similar etch rate or different etch rates.

The substrate 201 may include a semiconductor material, e.g., group IV semiconductors, group III-V semiconductors, or group II-VI semiconductors. For example, the group IV semiconductors may include silicon, germanium, or silicon-germanium. The substrate 201 may be provided in a form of a bulk wafer or an epitaxial layer. The substrate 201 may be a semiconductor substrate such as a silicon-on-insulator (SOI) substrate, a gallium-arsenic substrate, or a silicon germanium substrate. Unit devices (not shown) needed for forming a semiconductor apparatus such as various types of active devices or passive devices may be formed on the substrate 201. Alternatively, the substrate 201 may be an insulation substrate formed of $SiO_2$ or other inorganic oxide, or a glass substrate.

The etch target layer 210 may be a layer of a predetermined semiconductor material as described above with respect to the substrate 201. Also, the etch target layer 210 may be a poly-silicon layer.

A first material layer 220 may be formed on the etch target layer 210. The first material layer 220 may be formed of any material having a sufficient etch selectivity with respect to the etch target layer 210, but not limited thereto. For example, the first material layer 220 may be a carbon based material layer. In detail, the first material layer 220 may be, e.g., an amorphous carbon layer (ACL) or a spin-on hardmask (SOH) that is formed of a hydrocarbon compound having a relatively high carbon content of about 85 wt % to about 99 wt % to the total weight, or a derivative thereof.

In the process of forming the first material layer 220 into a SOH layer, first, an organic compound layer having a thickness of about 1000 Å to about 5000 Å is formed on the etch target layer 210. A spin coating process or other vapor deposition process may be used as necessary. The organic compound may be a hydrocarbon compound including an aromatic ring such as phenyl, benzene, or naphthalene, or a derivative thereof. The organic compound may be formed of a material having a relatively high carbon content of about 85 wt % to about 99 wt % with respect to the total weight. A carbon containing layer may be formed by first baking the organic compound layer at a temperature between about 150° C. to about 350° C. The first bake may be performed for about 60 seconds. Then, the carbon containing layer is second baked at a temperature between about 300° C. to about 550° C. so as to be cured. The second bake may be performed for about 30 seconds to about 300 seconds.

By curing the carbon containing layer through the second bake process, even when a vapor deposition is performed at a relatively high temperature of about 400° C. or higher to form another layer on the carbon containing layer, the carbon containing layer is not ill-affected during the vapor deposition process.

A first mold pattern 230 may be formed on the first material layer 220. The first mold pattern 230 may be formed of a material having an etch selectivity with respect to the first material layer 220 and a first spacer mask 240 of FIG. 3B that will be formed later, but the present inventive concept is not limited thereto. In this case, the first mold pattern 230 may be a photoresist pattern. However, the first mold pattern 230 is not limited to a photoresist pattern.

When the first mold pattern 230 is a photoresist pattern, for forming a more precise pattern, an anti-reflection coating (not shown) may be further provided between the first material layer 220 and the first mold pattern 230. The anti-reflection coating may be formed of, e.g., SiON.

Figure 3B:
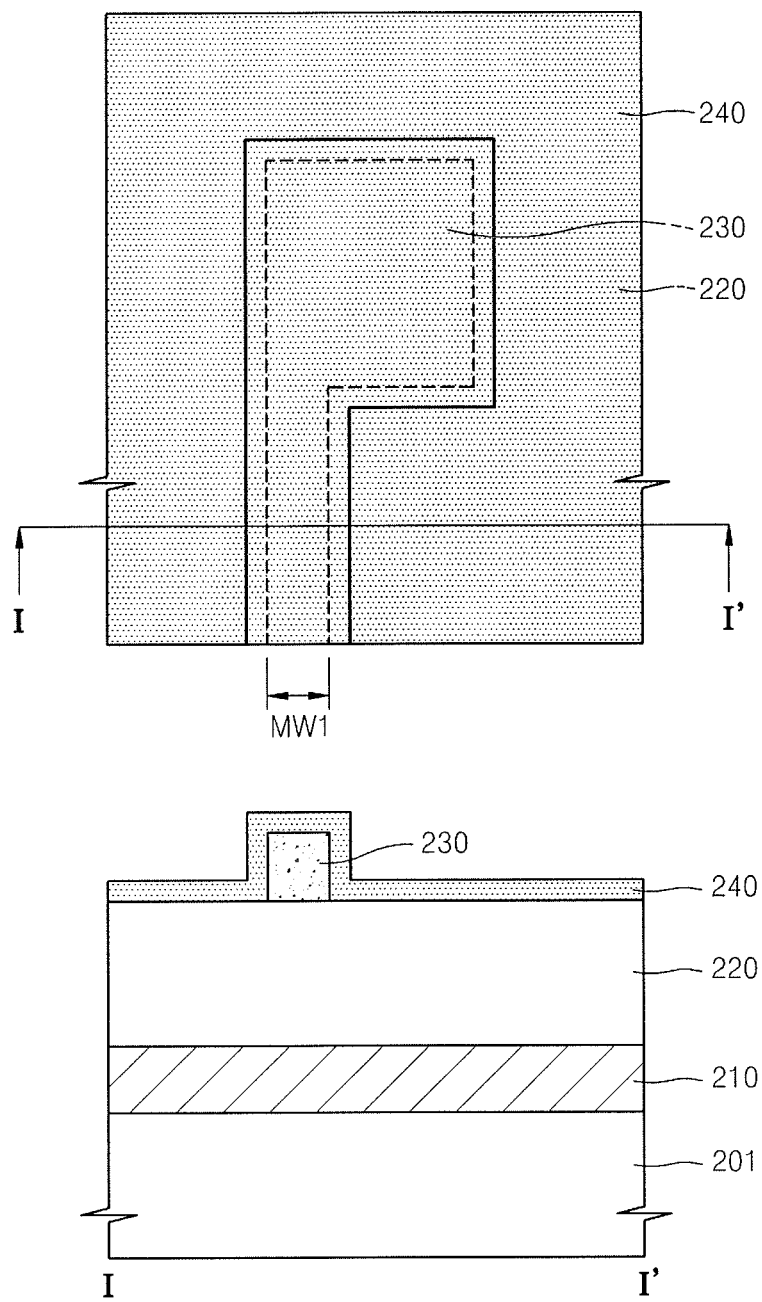

Referring to FIG. 3B, a first spacer material layer 240 is conformally formed on an exposed surface of the first material layer 220 and an entire surface of the first mold pattern 230. The first spacer material layer 240 may be formed by, for example, a chemical vapor deposition (CVD) method or an atomic layer deposition (ALD) method. However, the present inventive concept is not limited to the above methods.

The first spacer material layer 240 may be formed of a material having an etch selectivity with respect to the first material layer 220 and the first mold pattern 230. For example, the first spacer material layer 240 may be formed of a silicon oxide. The first spacer material layer 240 may have any suitable thickness, e.g., about ⅓ of a width MW1 of the first mold pattern 230.

Figure 3C:
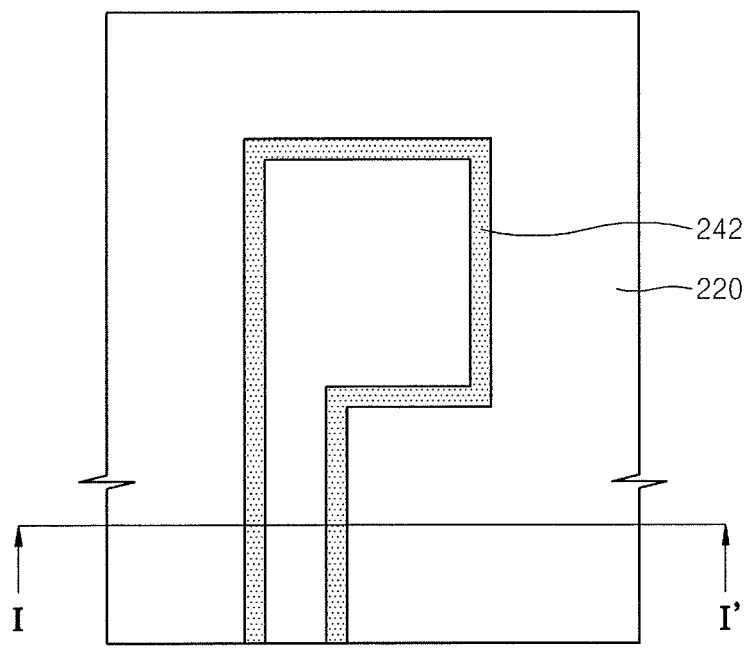
Figure 3C:
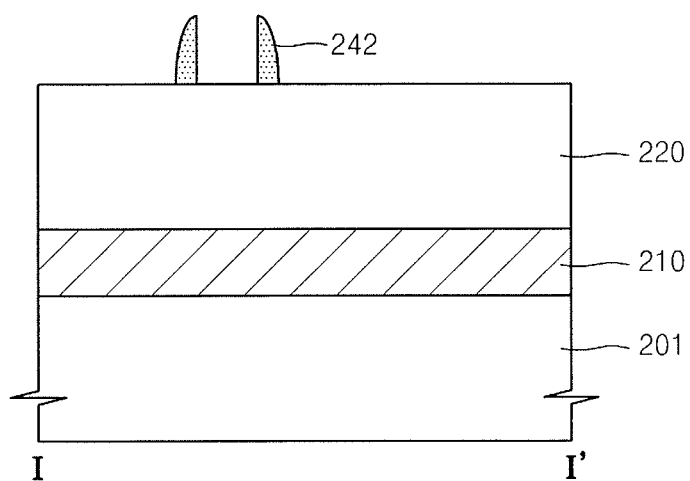

Referring to FIG. 3C, a first spacer mask 242 may be formed by anisotropically etching the first spacer material layer 240, followed by removal of the first mold pattern 230. In detail, portions of the first spacer material layer 240 may be removed, so only lateral portions, i.e., the first spacer mask 242, on sidewalls of the first mold pattern 230 may remain, followed by removal of the first mold pattern 230.

Removing portions of the first spacer material layer 240 to form the first spacer mask 242 may include etching. For example, $C_xF_y$ gas or $CH_xF_y$ gas, in which x and y each is an integer ranging from 1 to 10, may be used a main etching gas. At least one gas selected from $O_2$ gas and Ar gas may be mixed in the main etching gas for use. For example, $C_3F_6$, $C_4F_6$, $C_4F_8$, or $C_5F_8$ may be used as the $C_xF_y$ gas. For example, $CHF_3$ or $CH_2F_2$ may be used as the $CH_xF_y$ gas. The $O_2$ gas added to the main etching gas removes polymer byproducts produced during an etching process and decomposes the $C_xF_y$ gas. Also, Ar added to the main etching gas is used as a carrier gas and to facilitate ion bombarding. In etching the first spacer material layer 240, plasma of an etching gas selected from the above listed main etching gases is generated in an etching chamber, followed by etching in the plasma atmosphere. In some cases, plasma is not generated in the etching chamber, so etching may be performed in the selected etching gas atmosphere without ion energy. For example, a mixed gas of $C_4F_6$, $CHF_3$, $O_2$, and Ar may be used as an etching gas in order to etch the first spacer material layer 240 of FIG. 3B. In this case, while each gas is supplied such that the volume ratio of $C_4F_6$:$CHF_3$:$O_2$:Ar is about 1:6:2:14, a plasma type dry etching process may be performed for several to tens of seconds under a pressure of about 30 mT.

After the first spacer mask 242 is formed, the first mold pattern 230 of FIG. 3B may be removed using, for example, an aching or strip process according to a material forming the first mold pattern 230. The removal of the first mold pattern 230 may be performed under the condition that etching of the first spacer mask 242 and the first material layer 220 is suppressed.

Figure 3D:
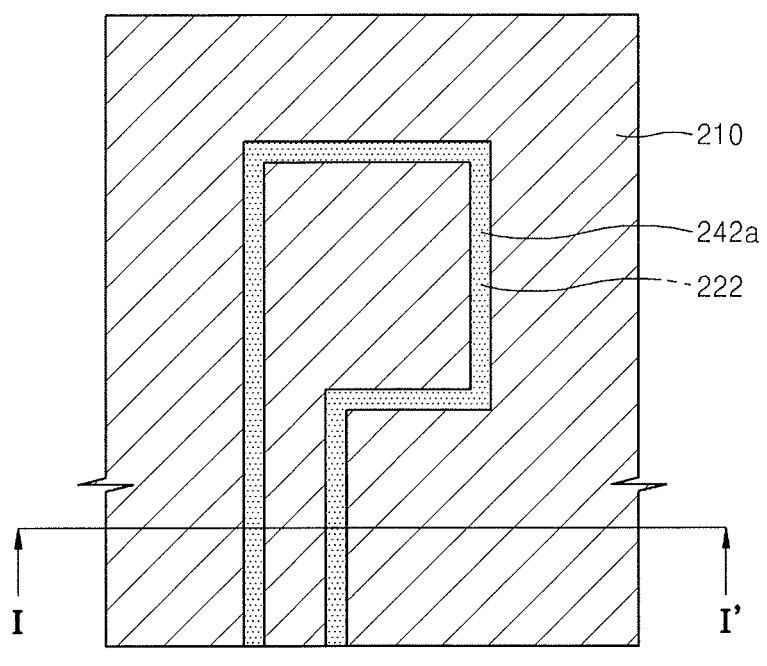
Figure 3D:
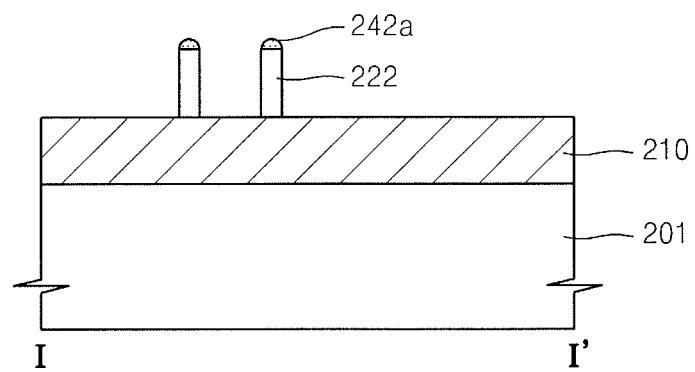

Referring to FIG. 3D, the first material layer 220 of FIG. 3B may be anisotropically etched using the first spacer mask 242 as an etch mask, so that a second mold pattern 222 may be formed on the etch target layer 210. The anisotropic etching method for forming the second mold pattern 222 may include a reactive ion etching (RIE) method or an inductively coupled plasma (ICP) etching method.

Residue 242a of the first spacer mask 242 of FIG. 3C may remain on an upper surface of the second mold pattern 222. The residue 242a of the first spacer mask 242 may be removed for a subsequent process. To remove the residue 242a of the first spacer mask 242, ashing may be performed in an oxidation atmosphere.

Figure 3E:
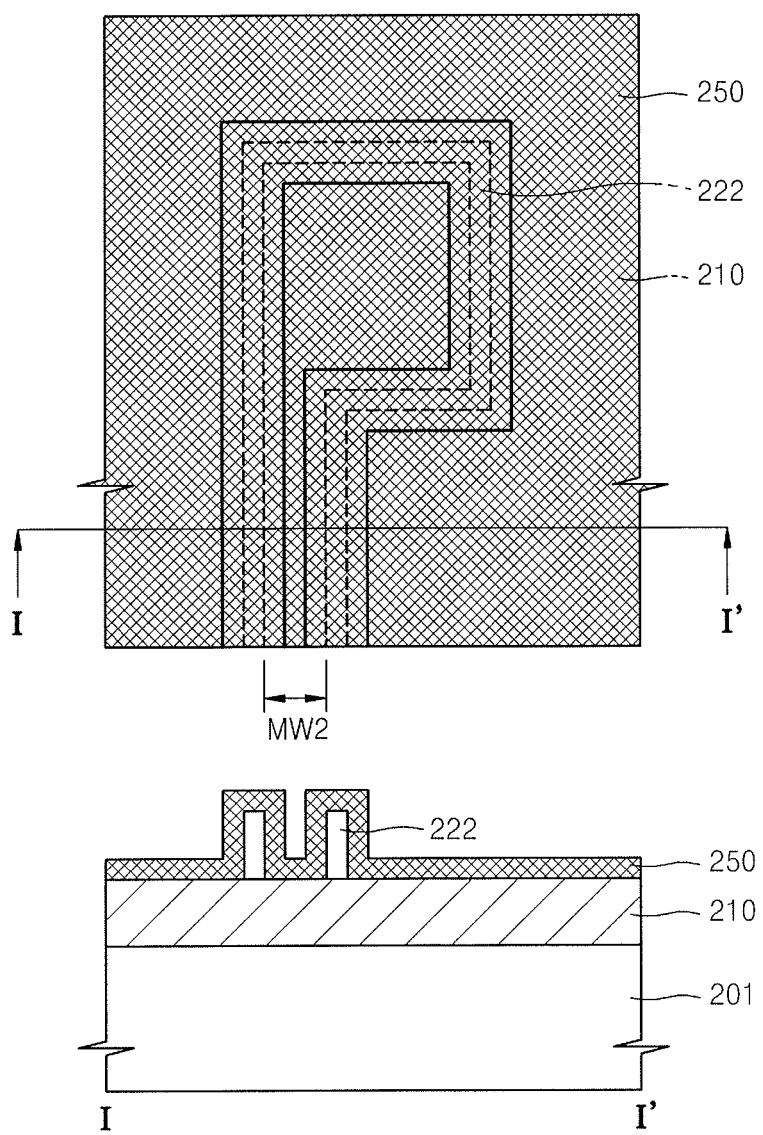

Referring to FIG. 3E, a second spacer material layer 250 may be conformally formed on exposed surfaces of the etch target layer 210 and the second mold pattern 222. The second spacer material layer 250 may be formed by, for example, the CVD or ALD method. However, the present inventive concept is not limited thereto.

The second spacer material layer 250 may be formed of a material having an etch selectivity with respect to the etch target layer 210 and the second mold pattern 222. For example, the second spacer material layer 250 may be silicon oxide. The second spacer material layer 250 may have any suitable thickness, e.g., about ⅓ of the width MW2 by which the second mold patterns 222 are separated from each other.

Figure 3F:
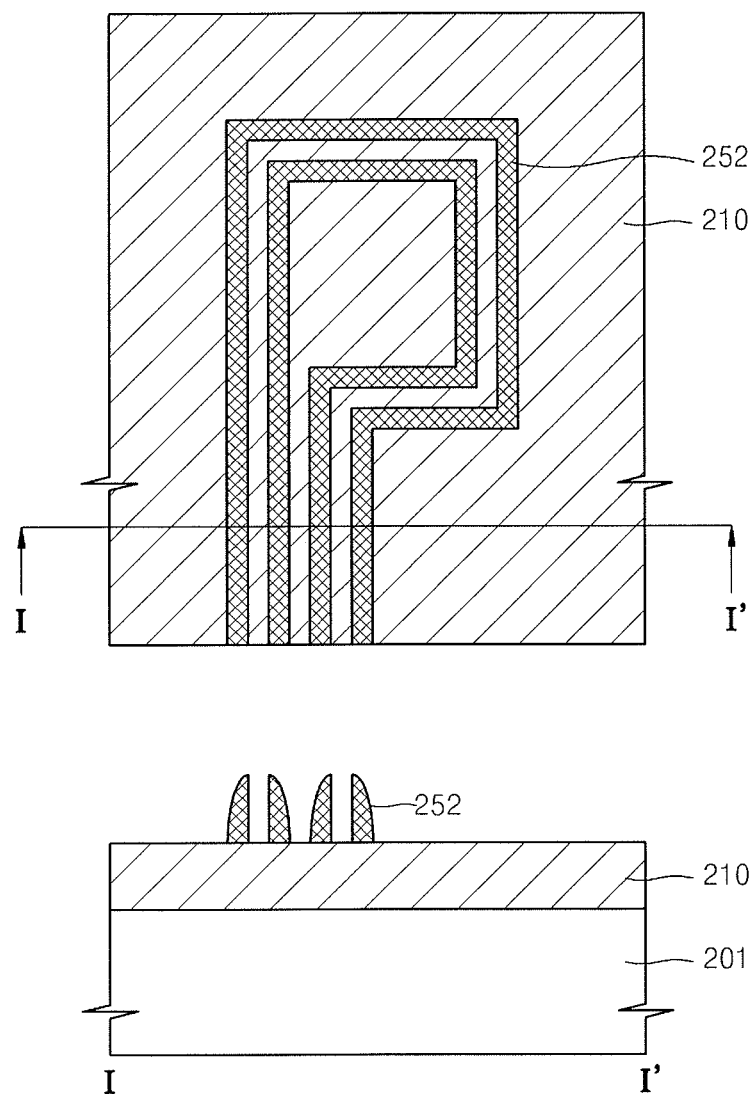

Referring to FIG. 3F, the second spacer material layer 250 of FIG. 3E may be anisotropically etched, so that the second spacer mask 252 is formed, followed by removal of the second mold pattern 222. Since a method of forming the second spacer mask 252 by anisotropically etching the second spacer material layer 250 of FIG. 3E is the same as that described previously with respect to the first spacer mask 242 in FIGS. 3B and 3C, a detailed description thereof will be omitted herein.

After the second spacer mask 252 is formed, the second mold pattern 222 of FIG. 3E may be removed using, for example, an ashing or strip process according to a forming material. The removal of the second mold pattern 222 of FIG. 3E may be performed under the condition that etching of the second spacer mask 252 and the etch target layer 210 is suppressed.

Figure 3G:
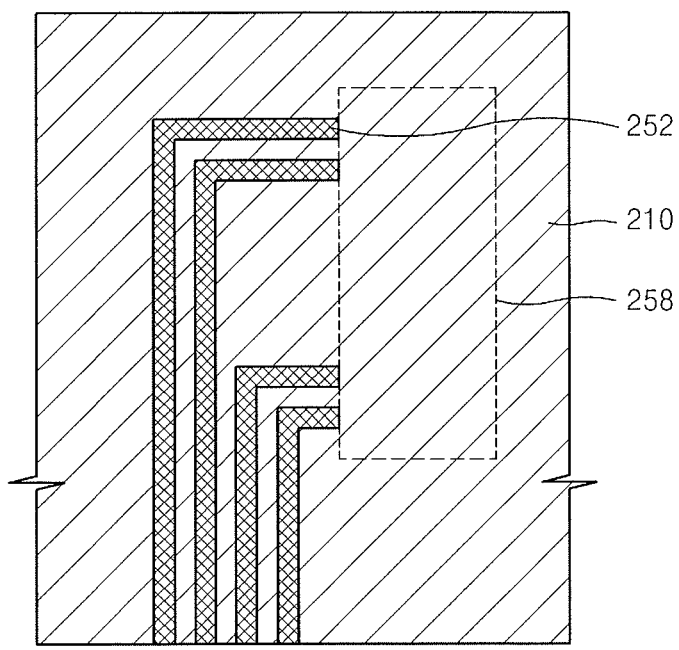

Referring to FIG. 3G, a portion of the second spacer mask 252 may be removed by trimming in a trimming area 258. To trim a portion of the second spacer mask 252, an etch mask (not shown) for exposing the trimming area 258 may be formed, followed by removing the portion of the second spacer mask 252 in the trimming area 258 through anisotropic etching. The respective micropatterns may be separated from each other by the trimming as above.

Figure 3H:
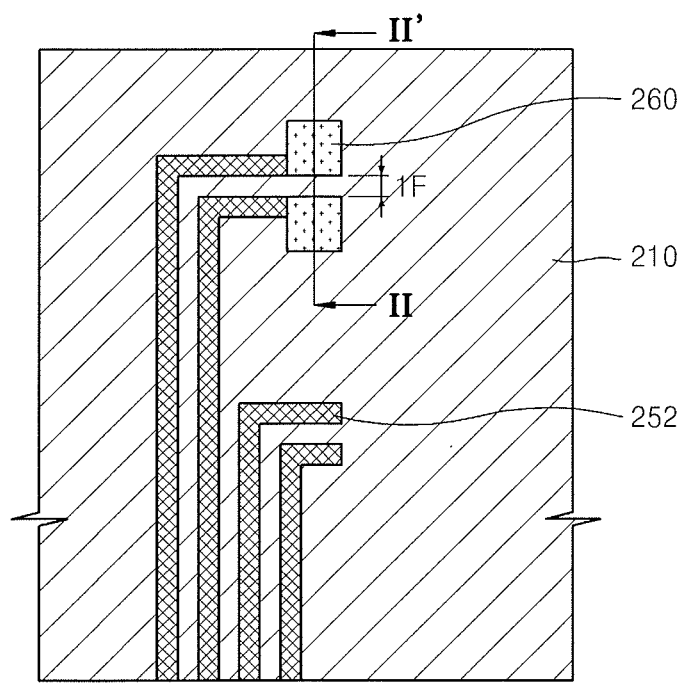
Figure 3H:
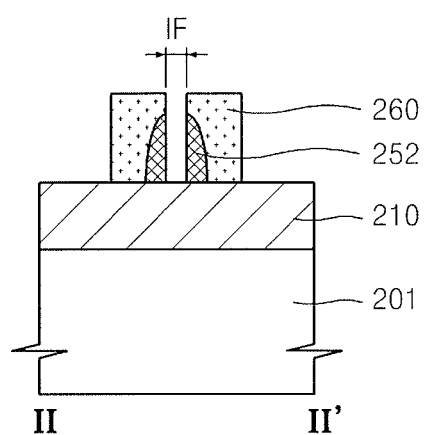

Referring to FIG. 3H, a pad mask pattern 260 may be formed to overlap at least some pattern of the corresponding second spacer mask 252. To form the pad mask pattern 260, a pad mask pattern material layer (not shown) may be formed on the entire surface of the etch target layer 210 and the second spacer mask 252, and then the pad mask pattern 260 may be formed using a photolithography method.

As illustrated in FIG. 3H, since the interval between the two neighboring second spacer mask 252 is merely 1 F, where F denotes the minimum feature size, it can be seen that a misalignment margin of the pad mask pattern 260 is narrow. In detail, the minimum feature size F is the minimum linewidth formed by the QPT, which is much smaller than the minimum linewidth that may be optically embodied. As an error range of accuracy is larger than the minimum feature size F in relation to the arrangement of an optically embodied pad, the misalignment margin of the pad may be narrow.

Figure 3I:
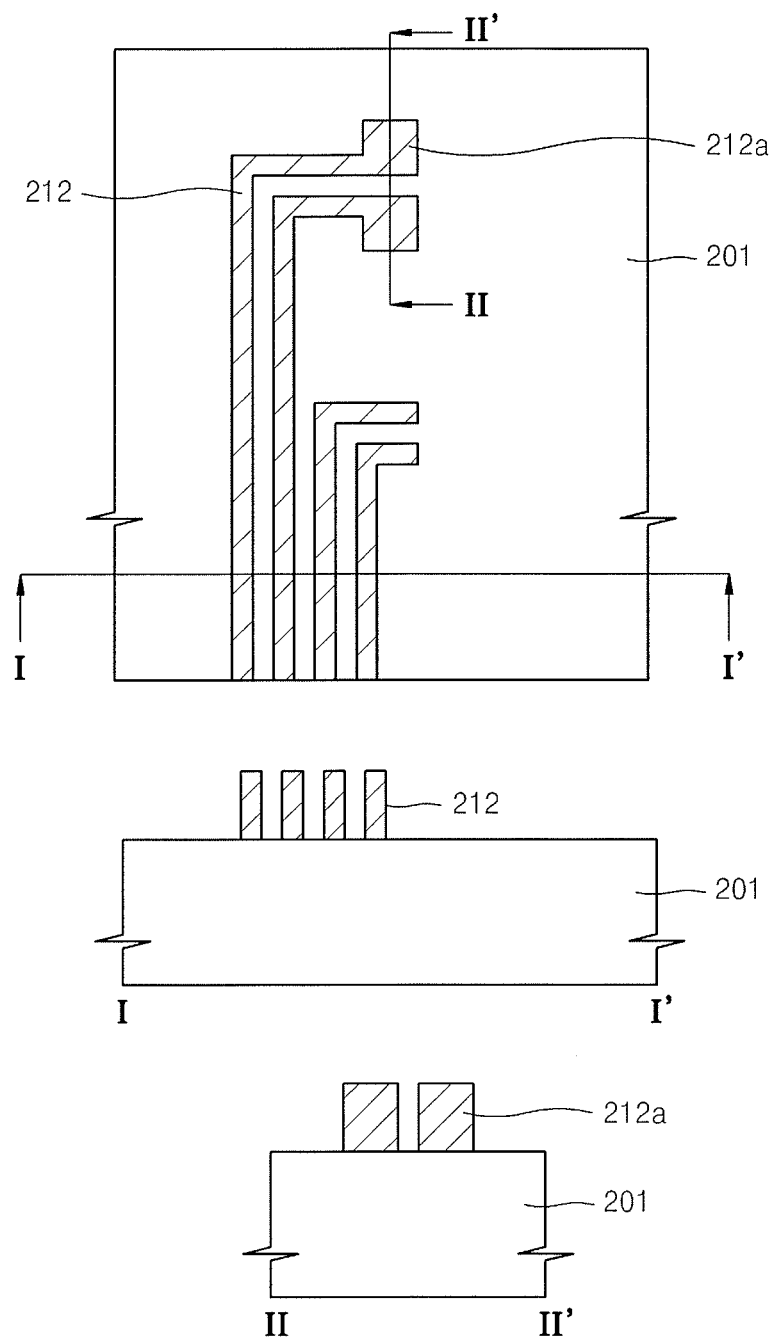

Referring to FIG. 3I, the etch target layer 210 may be anisotropically etched using the second spacer mask 252 and the pad mask pattern 260 as etch masks, so that a target pattern 212 including a pad pattern 212a may be obtained. Since the method of anisotropically etching the etch target layer 210 is already described above, a detailed description thereof will be omitted herein.

FIGS. 4A-4F are plan views of stages in a method of forming separated micropatterns according to an exemplary embodiment of the present inventive concept. A stack structure illustrated in FIGS. 4A-4F may be the same as that illustrated in FIGS. 3A-3I. Accordingly, detailed descriptions of the respective material layers constituting the stack structure and a method of forming the same will be omitted herein.

Figure 4A:
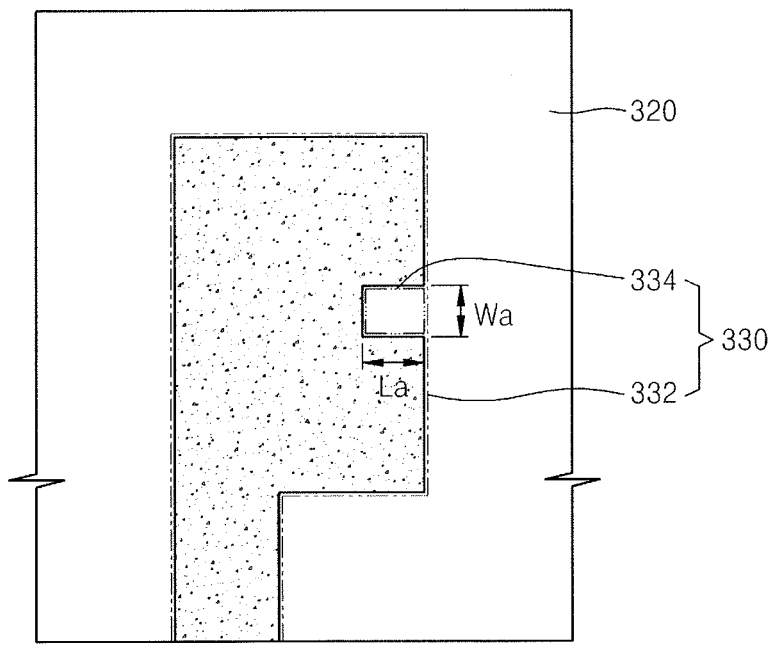
FIGS. 4A-4F, 5A-5F, 6A-6F, 7A-7F, and 8A-8F illustrate plan views of stages in methods of forming micropatterns according to exemplary embodiments of the inventive concept.

Referring to FIG. 4A, a first mold pattern 330 may be formed on a first material layer 320. The first mold pattern 330 may include a main pattern 332 and a separation-assist pattern 334. The separation-assist pattern 334 may include a recess pattern as illustrated in FIG. 4A, e.g., the separation-assist pattern 334 may define a recess of a predetermined size and shape within the main pattern 332. The recess pattern may include a predetermined length La and a predetermined width Wa. The length La may be defined by a length of an extension of the recess pattern toward the inside of the main pattern 332 from one side of the main pattern 332 where the recess pattern is formed. Also, the width Wa may be defined by a length of an extension of the recess pattern along one side of the main pattern 332 where the recess pattern is formed.

The width Wa of the recess pattern that is the separation-assist pattern 334 may have a size of about 1 F to 3 F, based on the minimum feature size F. However, the present inventive concept is not limited thereto and the width Wa may have a larger size than the above size. The width Wa may be determined considering a width of a first spacer mask 342 of FIG. 4B, which will be formed later. That is, the width Wa may increase when the width of the first spacer mask 342 is large.

The length La of the recess pattern that is the separation-assist pattern 334 may be determined considering a degree of separation of the separated micropatterns that will be formed later. That is, the length La may be determined within a range in which a misalignment margin may be sufficiently secured, which will be described in detail later.

Figure 4B:
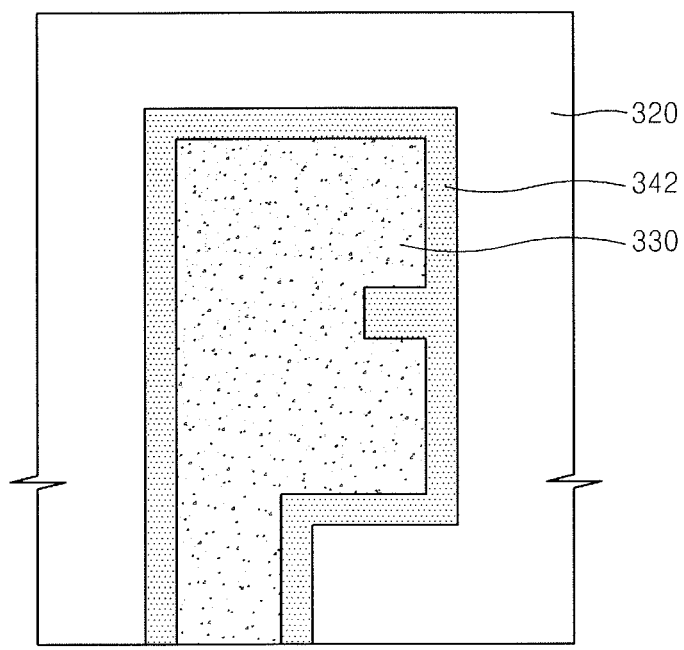

Referring to FIG. 4B, the first spacer mask 342 having a first width may be formed on a side wall of the first mold pattern 330. In detail, a first spacer material layer (not shown) may be formed conformally on the overall surface of the first material layer 320 and the first mold pattern 330, followed by an anisotropic etching of the first spacer material layer to form the first spacer mask 342 on, e.g., only on, sidewalls, e.g., entire sidewalls, of the first mold pattern 330. Since this process is already described in detail with reference to FIGS. 3B and 3C, an additional description thereof will be omitted herein.

The first spacer mask 342 may be formed to cover the entire surface of the recess pattern with respect to the length La and the width Wa of the recess pattern. However, there is no need for the first spacer mask 342 to completely fill the recess pattern with respect to the depth of FIG. 4B, that is, the thickwise direction of the main pattern 332. For example, the first spacer mask 342 may extend along a perimeter of the recess pattern to completely cover only sidewalls of the main pattern 332, e.g., a center of the recess pattern may not include the first spacer mask 342 (not shown).

Figure 4C:
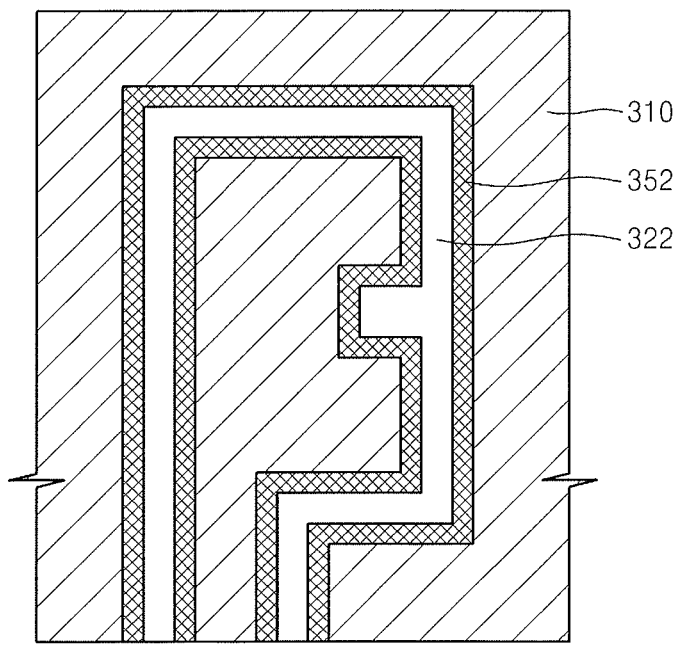

Referring to FIG. 4C, the first mold pattern 330 of FIG. 4B is removed. Next, the first material layer 320 of FIG. 4B may be anisotropically etched using the first spacer mask 342 of FIG. 4B as an etch mask.

When the first mold pattern 330 of FIG. 4B is a photoresist pattern, the first mold pattern 330 of FIG. 4B may be easily removed by ashing or wet etching. Also, since the method of etching the first material layer 320 of FIG. 4B is already described above, a detailed description thereof will be omitted herein. As a result of the anisotropic etching, a portion of an etch target layer 310 may be exposed. For example, the entire first material layer 320 not covered by the first spacer mask 342 may be removed to expose the etch target layer 310 (not shown).

Then, the first spacer mask 342 may be removed to expose a portion of the first material layer 320, i.e., a portion remaining under the first spacer mask 342, to form a second mold pattern 322. In other words, a portion of the first material layer 320, i.e., the second mold pattern 322, shaped by the first spacer mask 342 may remain on the etch target payer 310.

Then, as illustrated in FIG. 4C, a second spacer mask 352 may be formed on a sidewall of the second mold pattern 322. Since the method of forming the second spacer mask 352 is substantially the same as the method of forming the first spacer mask 342 of FIG. 4B, a detailed description thereof will be omitted herein.

Figure 4D:
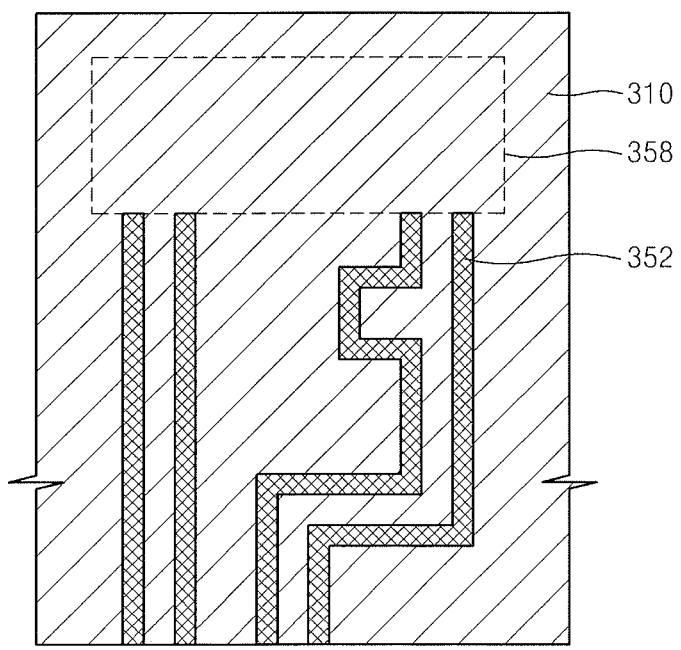

Referring to FIG. 4D, the second mold pattern 322 of FIG. 4C may be removed. When the material used for the second mold pattern 322 of FIG. 4B is SOH, the second mold pattern 322 of FIG. 4B may be easily removed by ashing in an oxidation atmosphere.

Then, since the second spacer mask 352 forms a loop by being formed around the second mold pattern 322 of FIG. 4C, the second spacer mask 352 is appropriately trimmed to separate the second spacer mask 352 from one another. The trimming may be performed by forming a mask layer (not shown) exposing a trimming area 358, for example, a portion indicated by a dotted line of FIG. 4D, on overall surfaces of the second spacer mask 352 and the etch large layer 310 and then removing the second spacer mask 352 that is exposed, by etching. The mask layer for the trimming may be formed of a material having an etch selectivity with respect to the second spacer mask 352, and the present inventive concept is not limited thereto. Also, the second spacer mask 352 may be removed by anisotropic or isotropic etching.

Then, the mask layer is removed so that the trimmed second spacer mask 352 may be obtained. That is, after the trimming, the second spacer masks 352 may include QPT-formed, disconnected portions that extend in parallel to each other. Further, the disconnected portions of the second spacer masks 352 may be separated further from each other at a position corresponding to the recess, i.e., at a position corresponding to the separation-assist pattern 334.

Figure 4E:
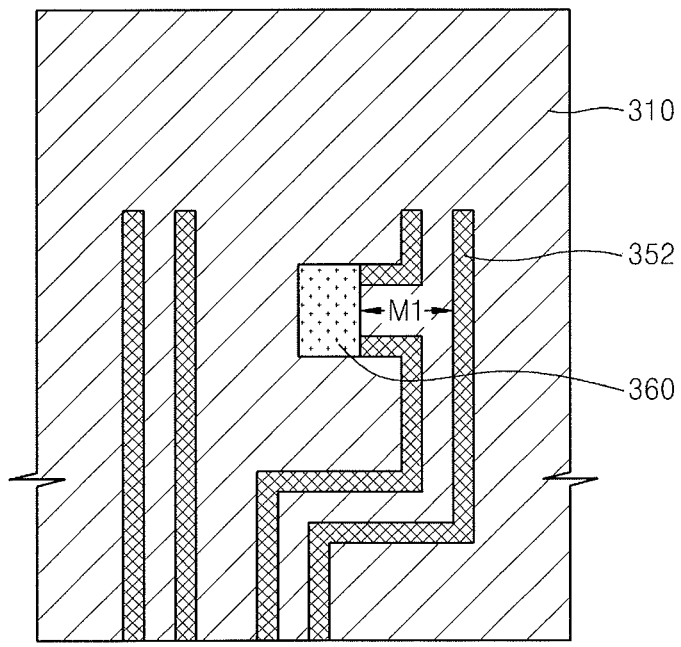

Referring to FIG. 4E, a pad mask pattern 360 having a predetermined size may be formed at a position where a pad is to be formed. To form the pad mask pattern 360, a photolithography method may be used after a pad mask pattern material layer (not shown) is formed over the overall surface of the etch target layer 310 and the second spacer mask 352. That is, the pad mask pattern material layer, except for a portion of the pad mask pattern material layer disposed at a position where the pad mask pattern 360 is to be formed, is exposed and removed by etching so that the pad mask pattern 360 may be formed.

As illustrated in FIG. 4E, the pad 360 may be in contact with one portion of the portions of the second spacer mask 352. The pad 360 may be formed at a region corresponding to the separation-assist pattern 334, so a distance M1 may be set between the pad mask pattern 360 and an adjacent portion of the second spacer mask 352, i.e., a portion extending parallel to the second spacer mask 352 in contact with the pad mask pattern 360. The distance M1 may be relative large due to recess, i.e., the separation-assist pattern 334, and may function as a misalignment margin with respect to the position of the pad mask pattern 360. If a misalignment margin having a larger width is needed, the length La of the recess pattern may be adjusted such that the distance M1 can be larger. Reversely, if a smaller misalignment margin is sufficient, then the length La of the recess pattern may be adjusted such that the distance M1 can be smaller. Therefore, in accordance with a desired misalignment margin, the length La of the separation-assist pattern 334 may be determined.

Figure 4F:
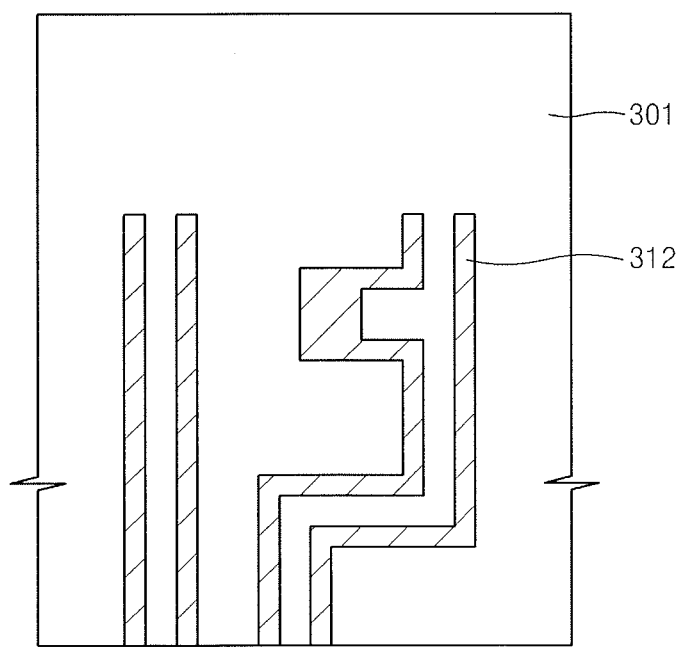

Referring to FIG. 4F, a target pattern 312 formed on a substrate 301 may be obtained by etching the etch target layer 310 of FIG. 4E using the second spacer mask 352 of FIG. 4E and the pad mask pattern 360 of FIG. 4E as an etch mask.

As described above, micropatterns exceeding an optical limit may be formed by using the above QPT method with an increased misalignment margin. That is, according to an exemplary embodiment, a method of forming separated micropatterns includes using a first mold pattern having a main pattern and a separation-assist pattern to form a first spacer mask having a first width around the first mold pattern. Next, the method includes forming a second mold pattern using the first spacer mask as an etch mask, forming a second spacer mask having a second width around the second mold pattern, and forming a target pattern using the second spacer mask as an etch mask. That is, since separated micropatterns are removed, a misalignment margin may be secured in relation to the arrangement of a pad mask pattern corresponding to each micropattern.

FIGS. 5A-5F are plan views illustrating a method of forming separated micropatterns according to another exemplary embodiment of the present inventive concept. A stack structure illustrated in FIGS. 5A-5F may be the same as that illustrated in FIGS. 3A-3I. Accordingly, detailed descriptions of the respective material layers constituting the stack structure and a method of forming the same will be omitted herein.

Figure 5A:
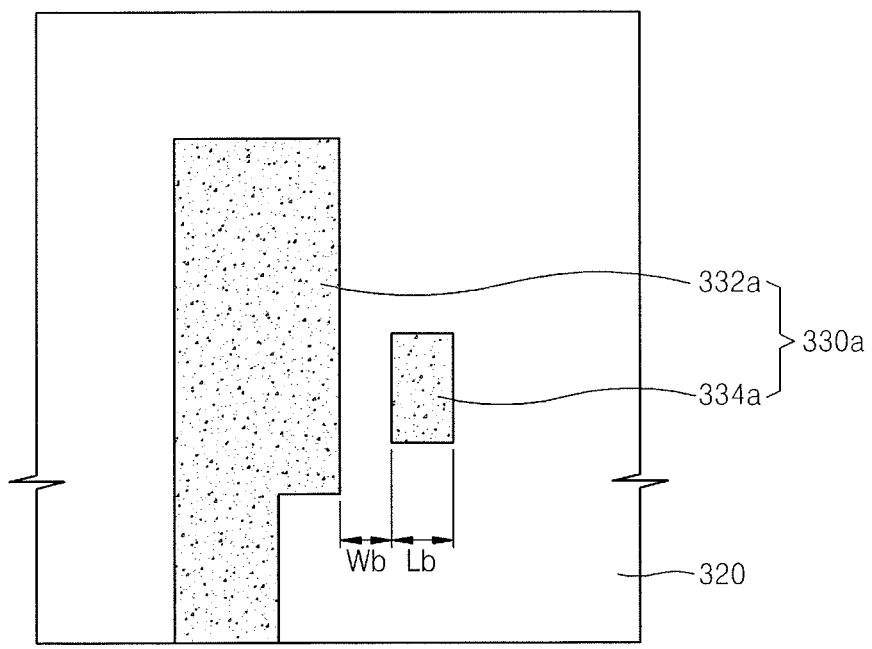

Referring to FIG. 5A, a first mold pattern 330a may be formed on the first material layer 320. The first mold pattern 330a may include a main pattern 332a and a separation-assist pattern 334a. The separation-assist pattern 334a may include an auxiliary pattern formed adjacent to the main pattern 332a, as illustrated in FIG. 5A. The auxiliary pattern may be separated from the main pattern 332a by a predetermined width Wb.

The width Wb is defined by a distance between the auxiliary pattern that is the separation-assist pattern 334a and the main pattern 332a, and may have a size of about 1 F to about 3 F, based on the minimum feature size F. However, the present inventive concept is not limited thereto and the width Wb may be larger than the above size. The width Wb may be determined considering the width of the first spacer mask 342 that will be formed later. That is, if the width of the first spacer mask 342 is large, the width Wb may increase accordingly.

A length Lb of the auxiliary pattern that is the separation-assist pattern 334 may be defined by an extension of the auxiliary pattern in a direction perpendicular to a side adjacent to the auxiliary pattern of the main pattern 332a. The length Lb may be determined considering a degree of separation of separated micropatterns to be formed later. That is, the length Lb may be selected in a range in which a misalignment margin with respect to another pattern may be sufficiently secured, which will be described later in detail.

Figure 5B:
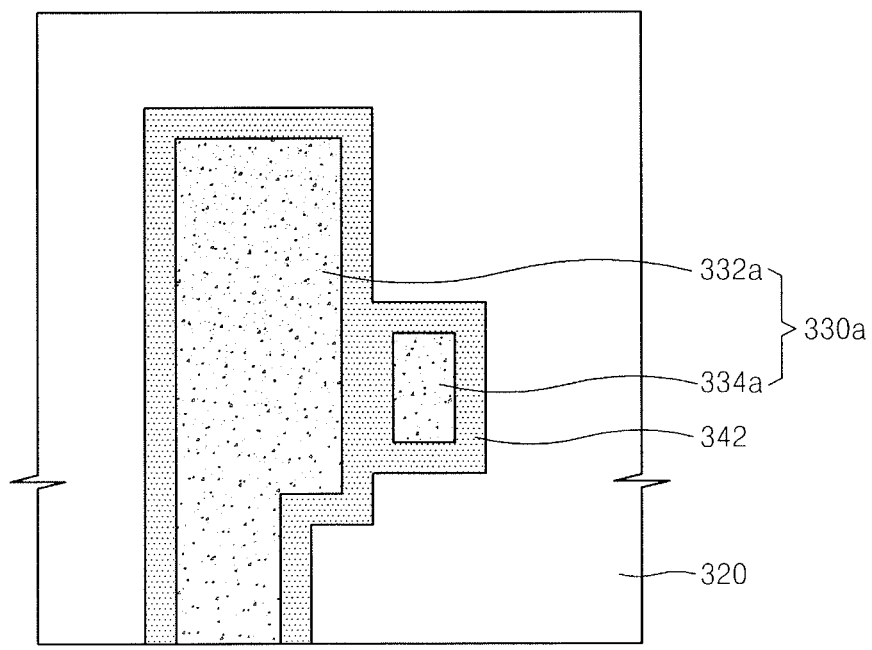

Referring to FIG. 5B, the first spacer mask 342 having a first width may be formed on a side wall of the first mold pattern 330a. The first spacer mask 342 may be formed by conformally forming a first spacer material layer (not shown) on an overall surface of the first material layer 320 and the first mold pattern 330a and performing an anisotropic etching of the first spacer material layer. Since this process is already described in detail with reference to FIG. 3C, an additional description thereof will be omitted herein.

The first spacer mask 342 may be formed to fill a gap between the main pattern 332a and the separation-assist pattern 334a with respect to the width Wb of separation of the auxiliary pattern. However, there is no need for the first spacer mask 342 to completely fill the gap between the main pattern 332a and the separation-assist pattern 334a with respect to the depth of FIG. 5B, that is, the thickness direction of the main pattern 332a.

Figure 5C:
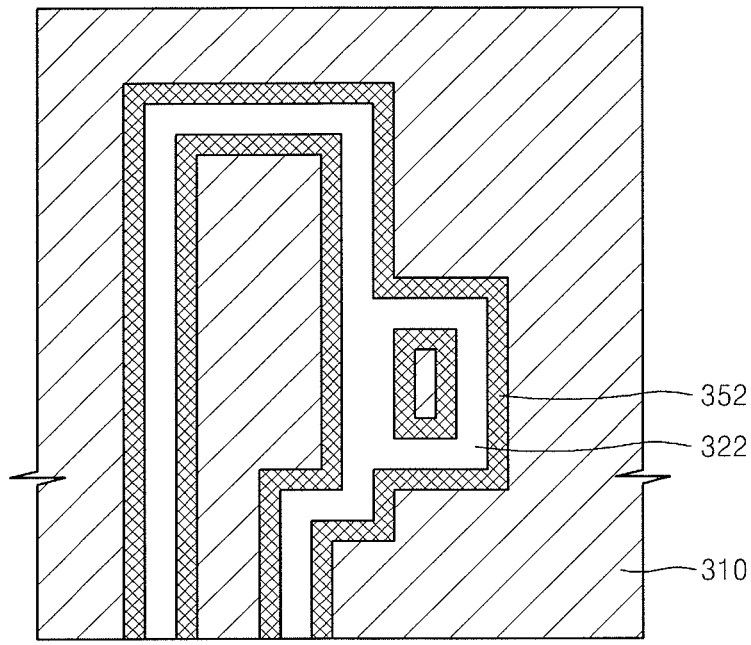

Referring to FIG. 5C, after the first mold pattern 330a is removed, the first material layer 320 may be anisotropically etched using the first spacer mask 342 as an etch mask. When the first mold pattern 330a is a photoresist pattern, the first mold pattern 330 may be easily removed by ashing or wet etching. Also, since the method of etching the first material layer 320 is already described in detail in the description with reference to FIG. 3D, a detailed description thereof will be omitted herein. As a result of the anisotropic etching, a portion of the etch target layer 310 may be exposed.

Then, the first spacer mask 342 that has been used for etching the first material layer 320 may be removed. After the first spacer mask 342 is removed, a portion of the first material layer 320 remaining under the first spacer mask 342 forms the second mold pattern 322.

Then, the second spacer mask 352 is formed on a side wall of the second mold pattern 322. Since the method of forming the second spacer mask 352 is substantially the same as the method of forming the first spacer mask 342, a detailed description thereof will be omitted herein.

Figure 5D:
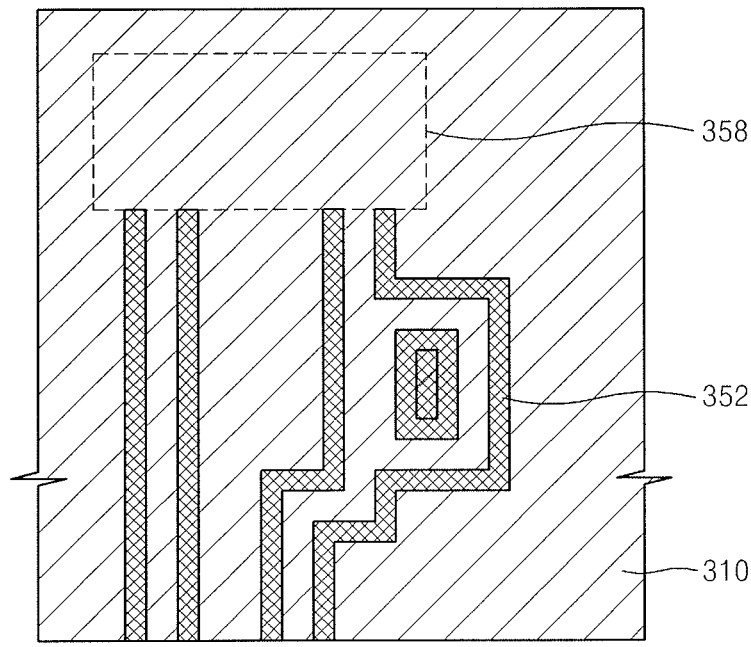

Referring to FIG. 5D, the second mold pattern 322 is removed. When the material used for the second mold pattern 322 is SOH, the second mold pattern 322 may be easily removed by ashing in an oxidation atmosphere.

Then, the second spacer mask 352 is appropriately trimmed to separate the portions of the second spacer mask 352 from one another. The trimming may be performed by forming a mask layer (not shown) for exposing the trimming area 358, for example, a portion indicated by a dotted line of FIG. 5D, on overall surfaces of the second spacer mask 352 and the etch large layer 310 and then removing the second spacer mask 352 that is exposed, by etching. The mask layer for the trimming may be formed of a material having an etch selectivity with respect to the second spacer mask 352, and the present inventive concept is not limited thereto. Also, the second spacer mask 352 may be removed by anisotropic or isotropic etching.

Then, the mask layer is removed so that the trimmed second spacer mask 352 may be obtained. That is, the second spacer masks 352 that are parallelly extended by the QPT may be separated further from each other at a position where the auxiliary pattern exists.

Figure 5E:
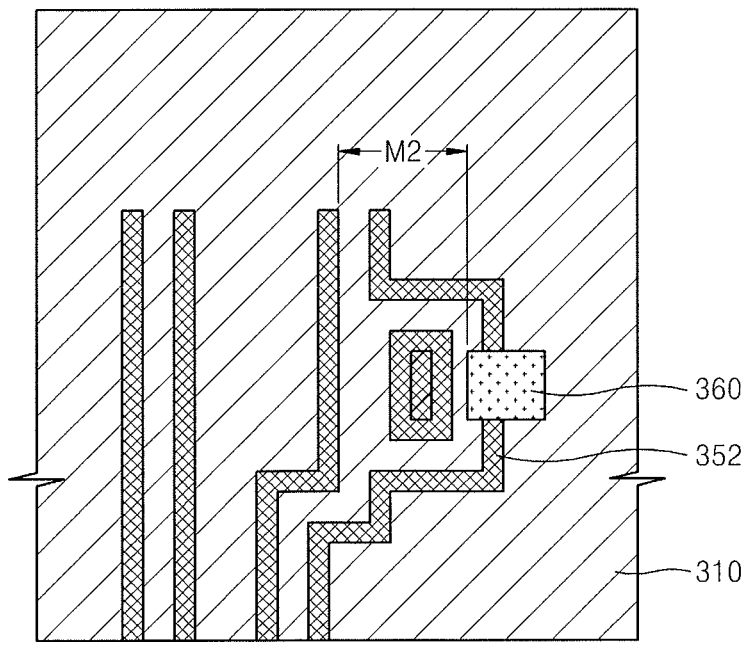

Referring to FIG. 5E, the pad mask pattern 360 having a desired size may be formed at a position where a pad is to be formed. To form the pad mask pattern 360, a photolithography method may be used after a pad mask pattern material layer (not shown) is formed over the overall surface of the etch target layer 310 and the second spacer mask 352. That is, the pad mask pattern material layer, except for a portion of the pad mask pattern material layer disposed at a position where the pad mask pattern 360 is to be formed, is exposed and removed by etching so that the pad mask pattern 360 may be formed.

As illustrated in FIG. 5E, a distance M2 between the pad mask pattern 360 and the second spacer mask 352 extending parallel to the second spacer mask 352 in contact with the pad mask pattern 360 may be increased. This may function as a misalignment margin with respect to the position of the pad mask pattern 360. If a misalignment margin having a larger width is needed, the length La of the auxiliary pattern may be adjusted such that the distance M2 can be larger. Reversely, if a smaller misalignment margin is sufficient, then the length La of the recess pattern may be adjusted such that the distance M2 can be smaller. In this point of view, as described with reference to FIG. 5A, the length La of the separation-assist pattern 334a may be determined.

Figure 5F:
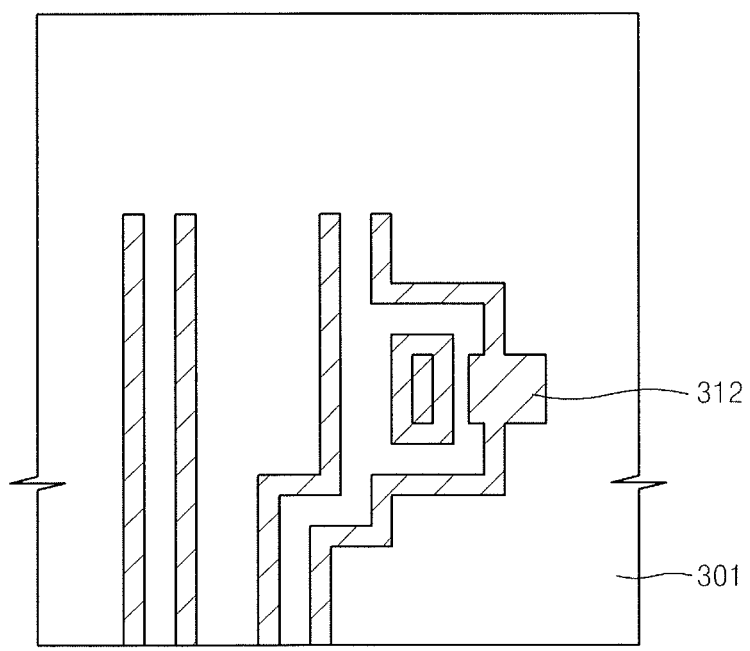

Referring to FIG. 5F, the target pattern 312 formed on the substrate 301 may be obtained by etching the etch target layer 310 using the second spacer mask 352 and the pad mask pattern 360 as an etch mask.

FIGS. 6A-6F are plan views illustrating a method of forming separated micropatterns according to another exemplary embodiment of the present inventive concept. A stack structure illustrated in FIGS. 6A-6F may be the same as that illustrated in FIGS. 3A-3I. Accordingly, detailed descriptions of the respective material layers constituting the stack structure and a method of forming the same will be omitted herein.

Figure 6A:
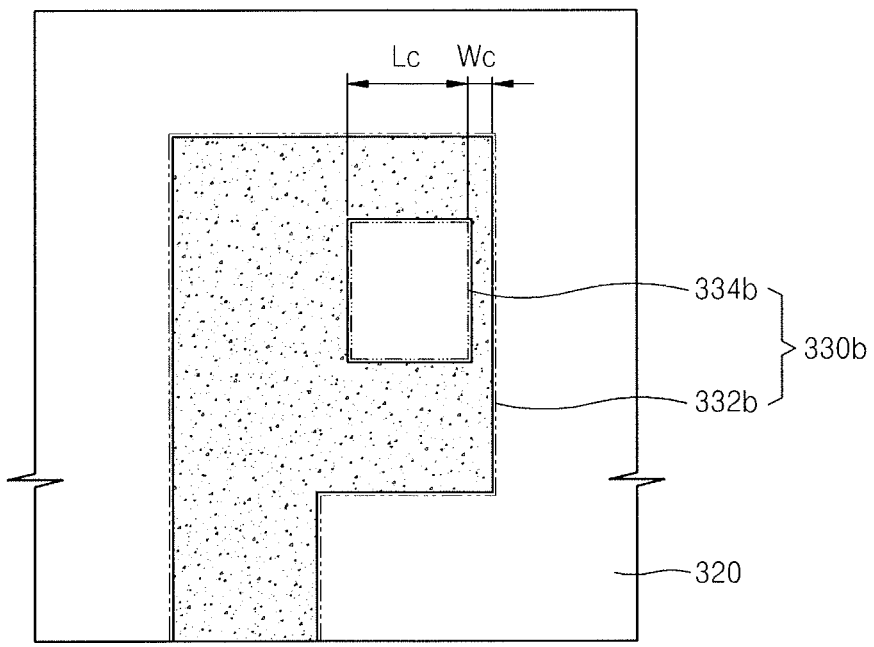

Referring to FIG. 6A, a first mold pattern 330b may be formed on the first material layer 320. The first mold pattern 330b may include a main pattern 332b and a separation-assist pattern 334b. The separation-assist pattern 334b may include a cavity pattern formed in the main pattern 332b, as illustrated in FIG. 6A. An edge of the cavity pattern may be separated from an edge of the main pattern 332b by a predetermined width Wc.

A width Wc that is defined by a distance between the edge of the cavity pattern that is the separation-assist pattern 334b and the edge of the main pattern 332b may have a size of about 1 F to about 3 F, based on the minimum feature size F. However, the present inventive concept is not limited thereto and the width Wc may be larger than the above size. The width Wc may be determined considering the width of the second spacer mask 352 that will be formed later. That is, if the width of the second spacer mask 352 is large, the width Wc may increase accordingly.

A length Lc of the cavity pattern that is the separation-assist pattern 334b may be defined by an extension of the cavity pattern in a direction perpendicular to the edge of the cavity pattern of the main pattern 332 having the closest distance from the edge of the cavity pattern. The length Lc may be determined considering a degree of separation of separated micropatterns to be formed later. That is, the length Lc may be selected in a range in which a misalignment margin with respect to another pattern may be sufficiently secured, which will be described later in detail.

Although the cavity pattern is illustrated to be rectangular, the cavity pattern may have a variety of shapes, e.g., a square, a diamond, a circle, an oval, etc. The cavity pattern may be distinguished from the above-described recess pattern and auxiliary pattern in that the cavity pattern is, e.g., horizontally surrounded by the first mold pattern 330b.

Figure 6B:
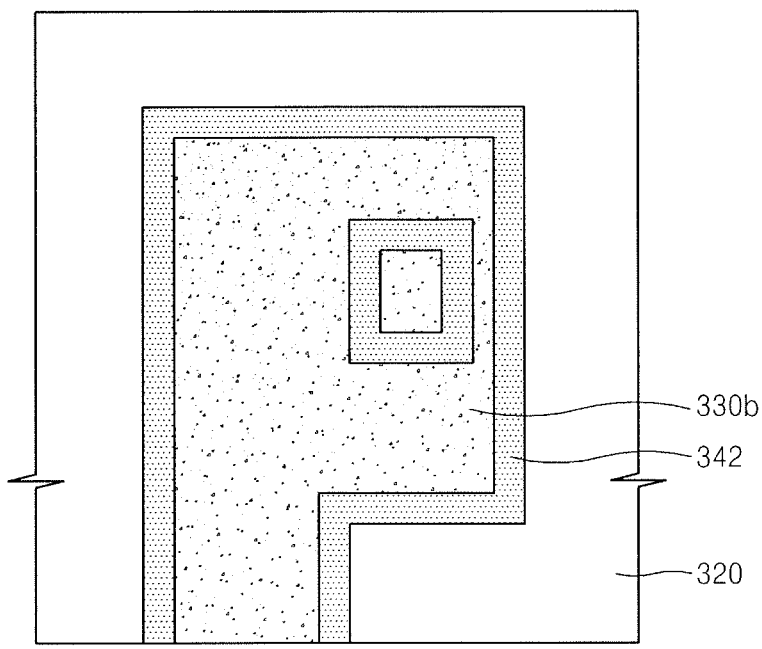

Referring to FIG. 6B, the first spacer mask 342 having a first width may be formed on a sidewall of the first mold pattern 330b. The first spacer mask 342 may be formed by conformally forming a first spacer material layer (not shown) on an overall surface of the first material layer 320 and the first mold pattern 330b and performing an anisotropic etching of the first spacer material layer. Since this process is already described in detail with reference to FIG. 3C, an additional description thereof will be omitted herein.

Figure 6C:
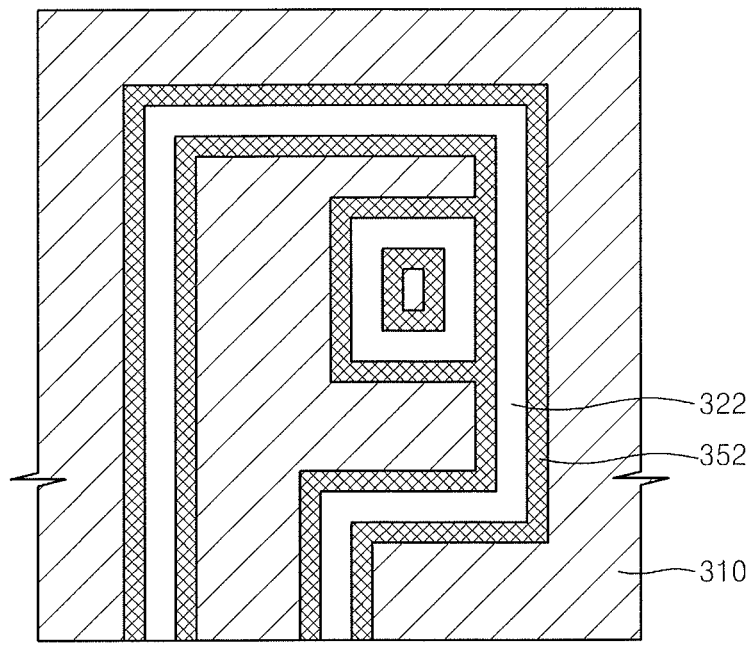

Referring to FIG. 6C, after the first mold pattern 330 is removed, the first material layer 320 may be anisotropically etched using the first spacer mask 342 as an etch mask.

When the first mold pattern 330 is a photoresist pattern, the first mold pattern 330 may be easily removed by ashing or wet etching. Also, since the method of etching the first material layer 320 is already described in detail in the description with reference to FIG. 3D, a detailed description thereof will be omitted herein. As a result of the anisotropic etching, a portion of the etch target layer 310 may be exposed.

Then, the first spacer mask 342 that has been used for etching the first material layer 320 may be removed. After the first spacer mask 342 is removed, a portion of the first material layer 320 remaining under the first spacer mask 342 forms the second mold pattern 322.

Then, the second spacer mask 352 is formed on a sidewall of the second mold pattern 322. Since the method of forming the second spacer mask 352 is substantially the same as the method of forming the first spacer mask 342, a detailed description thereof will be omitted herein.

The second spacer mask 352 may be formed to fill a gap between the second mold patterns 322 with respect to the width We between the edges according to the position of the cavity pattern. However, there is no need for the second spacer mask 352 to completely fill the gap between the second mold patterns 322 with respect to the depth of FIG. 6C, that is, the thickness direction of the main pattern 332.

Figure 6D:
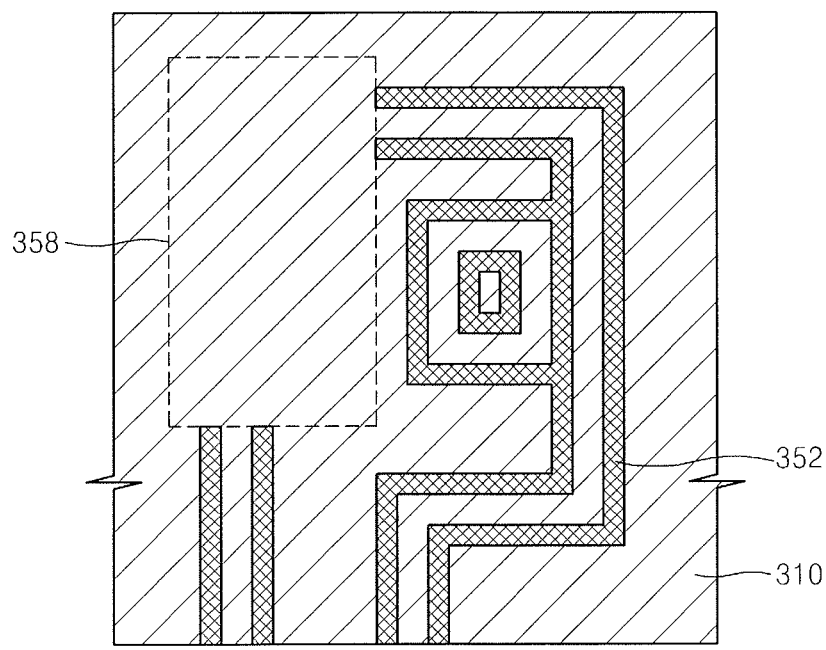

Referring to FIG. 6D, the second mold pattern 322 is removed. When the material used for the second mold pattern 322 is SOH, the second mold pattern 322 may be easily removed by aching in an oxidation atmosphere.

Then, the second spacer mask 352 is appropriately trimmed to separate the second spacer mask 352 from one another. The trimming may be performed by forming a mask layer (not shown) for exposing the trimming area 358, for example, a portion indicated by a dotted line of FIG. 6D, on overall surfaces of the second spacer mask 352 and the etch large layer 310 and then removing the second spacer mask 352 that is exposed, by etching. The mask layer for the trimming may be formed of a material having an etch selectivity with respect to the second spacer mask 352, and the present inventive concept is not limited thereto. Also, the second spacer mask 352 may be removed by anisotropic or isotropic etching.

Then, the mask layer is removed so that the second spacer mask 352 that is trimmed may be obtained. That is, the second spacer masks 352 that are parallelly extended by the QPT may be separated further from each other at a position where the cavity pattern exists.

Figure 6E:
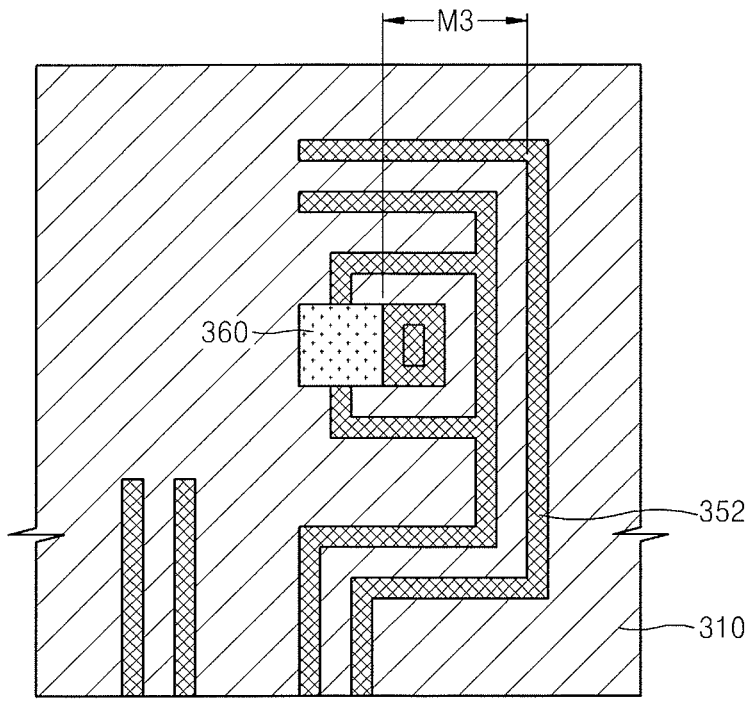

Referring to FIG. 6E, the pad mask pattern 360 having a desired size may be formed at a position where a pad is to be formed. To form the pad mask pattern 360, a photolithography method may be used after a pad mask pattern material layer (not shown) is formed over the overall surface of the etch target layer 310 and the second spacer mask 352. That is, the pad mask pattern material layer, except for a portion of the pad mask pattern material layer disposed at a position where the pad mask pattern 360 is to be formed, is exposed and removed by etching so that the pad mask pattern 360 may be formed.

As illustrated in FIG. 6E, a distance M3 between the pad mask pattern 360 and the second spacer mask 352 extending parallel to the second spacer mask 352 in contact with the pad mask pattern 360 much increases. This may function as a misalignment margin with respect to the position of the pad mask pattern 360. If a misalignment margin having a larger width is needed, the length Lc of the cavity pattern may be adjusted such that the distance M3 can be larger. Reversely, if a smaller misalignment margin is sufficient, then the length La of the cavity pattern may be adjusted such that the distance M3 can be smaller. In this point of view, as described with reference to FIG. 6A, the length Lc of the separation-assist pattern 334 may be determined.

Figure 6F:
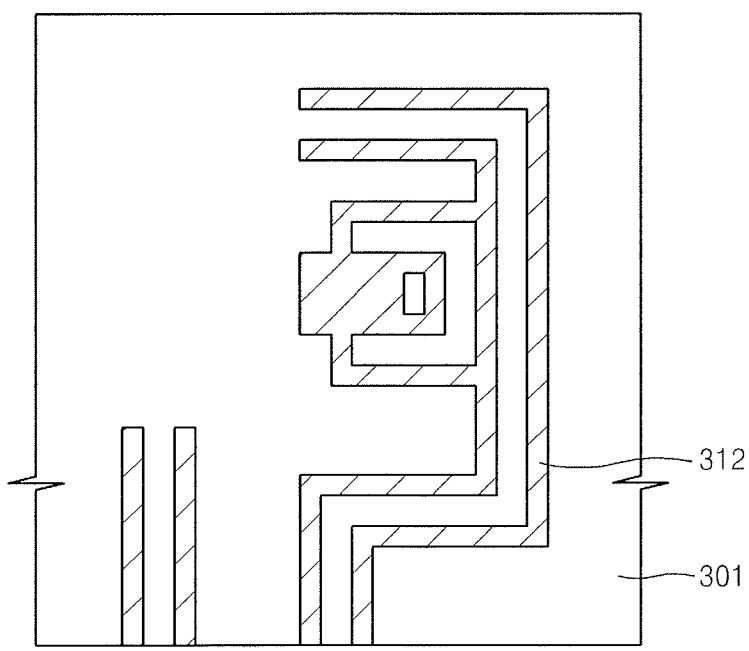

Referring to FIG. 6F, the target pattern 312 formed on the substrate 301 may be obtained by etching the etch target layer 310 using the second spacer mask 352 and the pad mask pattern 360 as an etch mask.

FIGS. 7A-7F are plan views illustrating a method of forming separated micropatterns according to another exemplary embodiment of the present inventive concept. A stack structure illustrated in FIGS. 7A-7F may be the same as that illustrated in FIGS. 3A-3I. Accordingly, detailed descriptions of the respective material layers constituting the stack structure and a method of forming the same will be omitted herein. Also, since the exemplary embodiment of FIGS. 7A-7F is similar to that of FIGS. 5A-5F, redundant descriptions will be omitted herein.

Figure 7A:
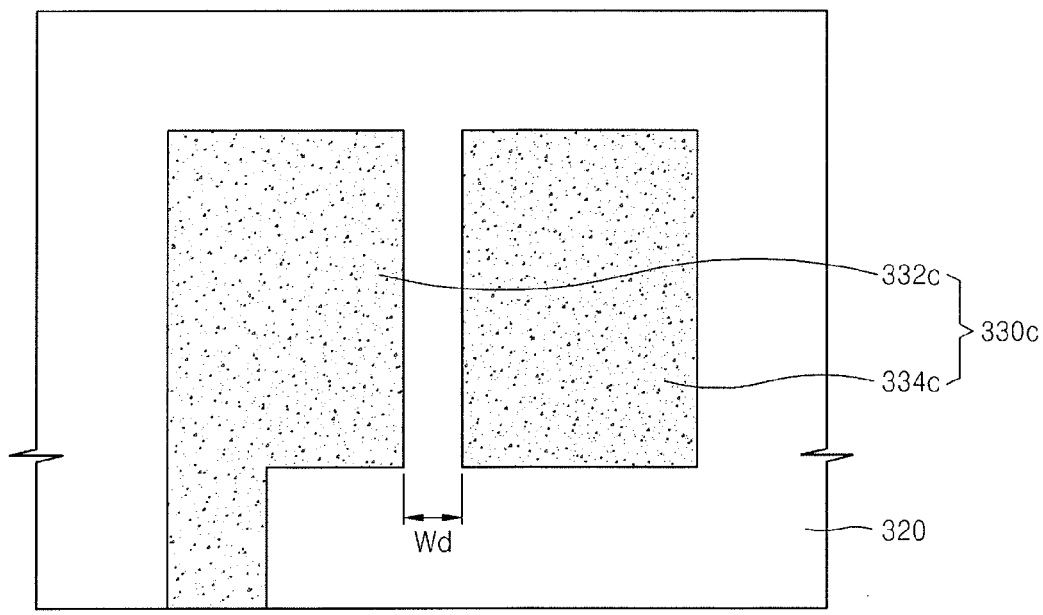

Referring to FIG. 7A, a first mold pattern 330c may be formed on the first material layer 320. The first mold pattern 330c may include a main pattern 332c and a separation-assist pattern 334c. The separation-assist pattern 334c may include an auxiliary pattern formed to be adjacent to the main pattern 332c as illustrated in FIG. 7A. The auxiliary pattern may be separated from the main pattern 332c by a predetermined width Wd.

A width Wd that is defined by a distance between the auxiliary pattern that is the separation-assist pattern 334c and the main pattern 332c may have a size of about 1 F to about 3 F, based on the minimum feature size F. However, the present inventive concept is not limited thereto and the width Wd may be larger than the above size. The width Wd may be determined considering the width of the first spacer mask 342 that will be formed later. That is, if the width of the first spacer mask 342 is large, the width Wd may increase accordingly.

Figure 7B:
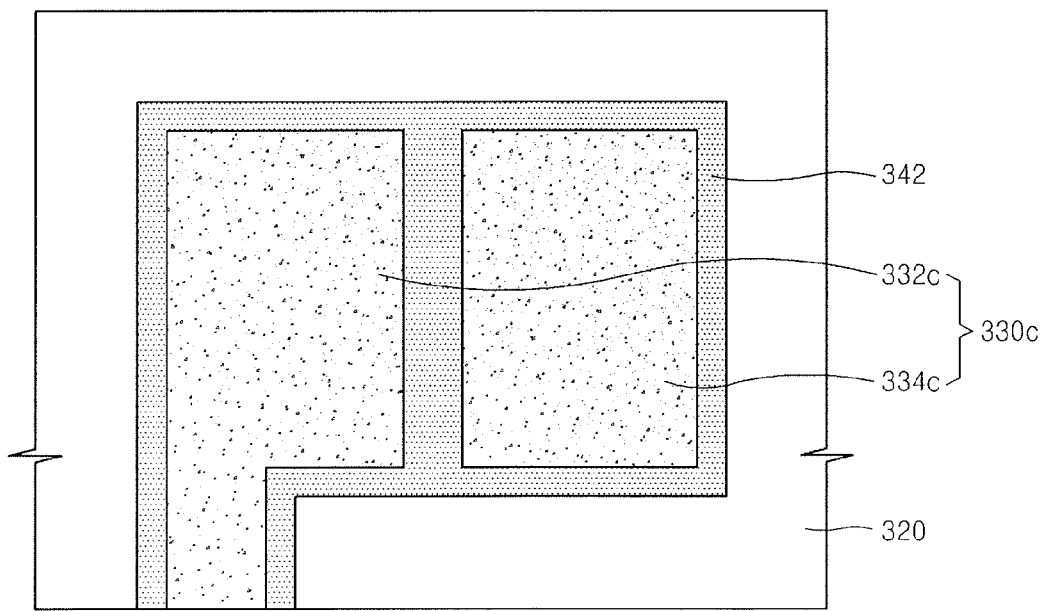

Referring to FIG. 7B, the first spacer mask 342 having a first width may be formed on a side wall of the first mold pattern 330c. The first spacer mask 342 may be formed by conformally forming a first spacer material layer (not shown) on an overall surface of the first material layer 320 and the first mold pattern 330 and performing an anisotropic etching of the first spacer material layer. Since this process is already described in detail with reference to FIG. 3C, an additional description thereof will be omitted herein.

Figure 7C:
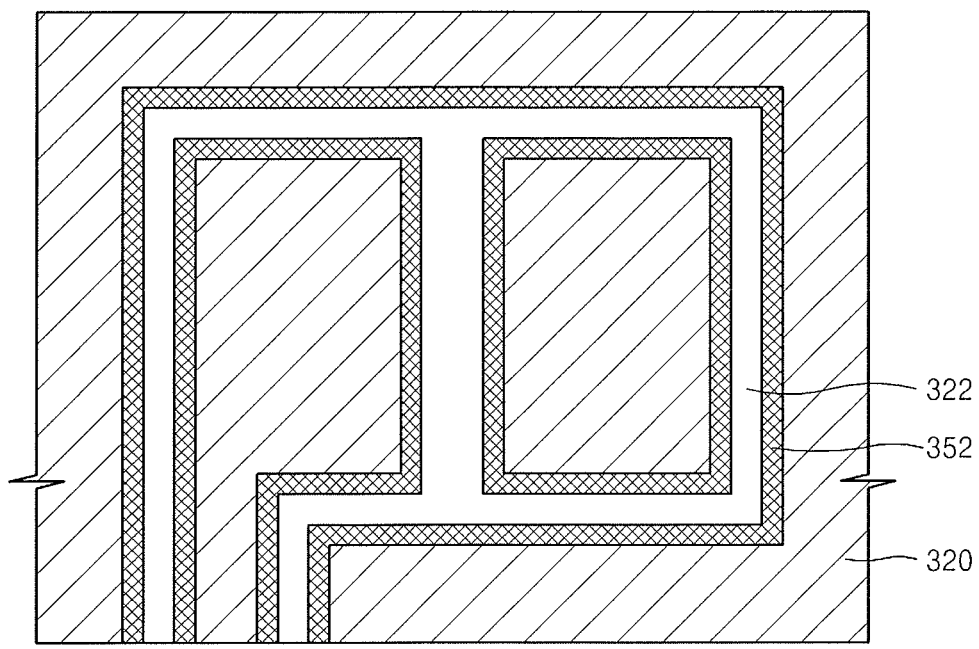

Referring to FIG. 7C, after the first mold pattern 330 is removed, the first material layer 320 may be anisotropically etched using the first spacer mask 342 as an etch mask.

When the first mold pattern 330c is a photoresist pattern, the first mold pattern 330 may be easily removed by ashing or wet etching. Also, since the method of etching the first material layer 320 is already described in detail in the description with reference to FIG. 3D, a detailed description thereof will be omitted herein. As a result of the anisotropic etching, a portion of the etch target layer 310 may be exposed.

Then, the first spacer mask 342 that has been used for etching the first material layer 320 may be removed. After the first spacer mask 342 is removed, a portion of the first material layer 320 of FIG. 7B remaining under the first spacer mask 342 forms the second mold pattern 322.

Then, the second spacer mask 352 is formed on a side wall of the second mold pattern 322. Since the method of forming the second spacer mask 352 is substantially the same as the method of forming the first spacer mask 342, a detailed description thereof will be omitted herein.

Figure 7D:
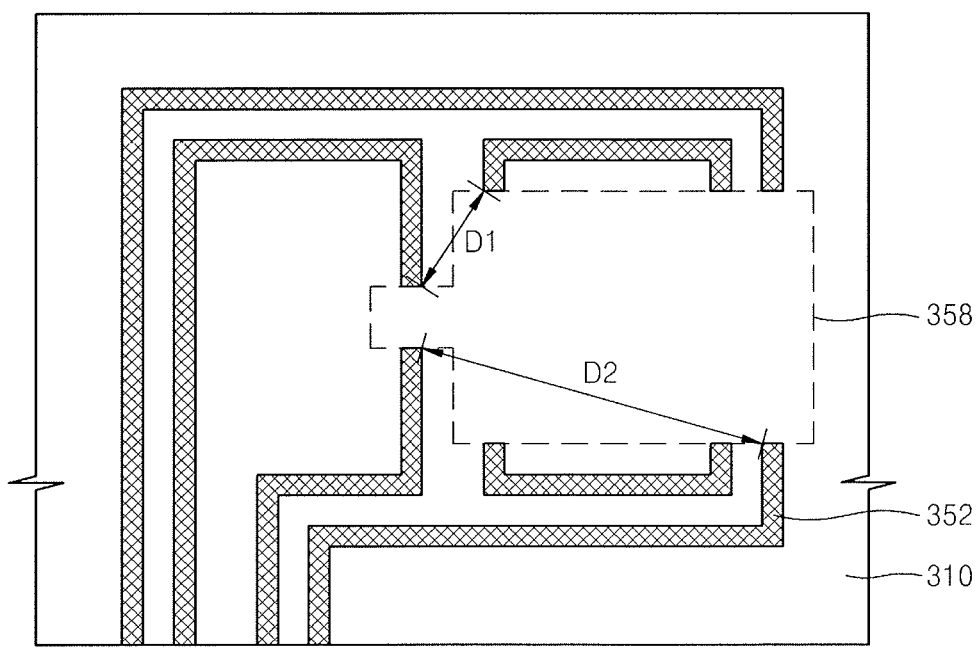

Referring to FIG. 7D, the second mold pattern 322 is removed. When the material used for the second mold pattern 322 is SOH, the second mold pattern 322 may be easily removed by ashing in an oxidation atmosphere.

Then, the second spacer mask 352 is appropriately trimmed to separate the second spacer mask 352 from one another. Since the trimming method is described above with reference to FIG. 5D, a detailed description thereof will be omitted herein. However, by appropriately selecting the shape of an opening portion corresponding to a trimming area 358, that is, a portion indicated by a dotted line of FIG. 7D, which is exposed for trimming, a misalighment margin of a pad mask pattern to be formed later may be secured.

As illustrated in FIG. 7D, a shape of the trimming area 358 in which a protrusion is added to a rectangle may increase a distance between ends of two micropatterns extending parallel to each other. However, the protrusion of the trimming area 358 is overlapped with any one of the two parallel micropatterns. To this end, one side of the rectangle needs to be located between the two parallel micropatterns.

By doing so, a trimmed length of the second spacer mask 352 from a portion derived from the main pattern 332c may be different from a trimmed length of the second spacer mask 352 from a portion derived from the separation-assist pattern 334. As a result, distances D1 and D2 between an end of the portion derived from the main pattern 332c and an end of the portion derived from the separation-assist pattern 334c may be greater than the distance of two neighboring parallel second spacer masks 352 before trimming. For example, the distances D1 and D2 may be greater than about 3 F or 5 F.

Figure 7E:
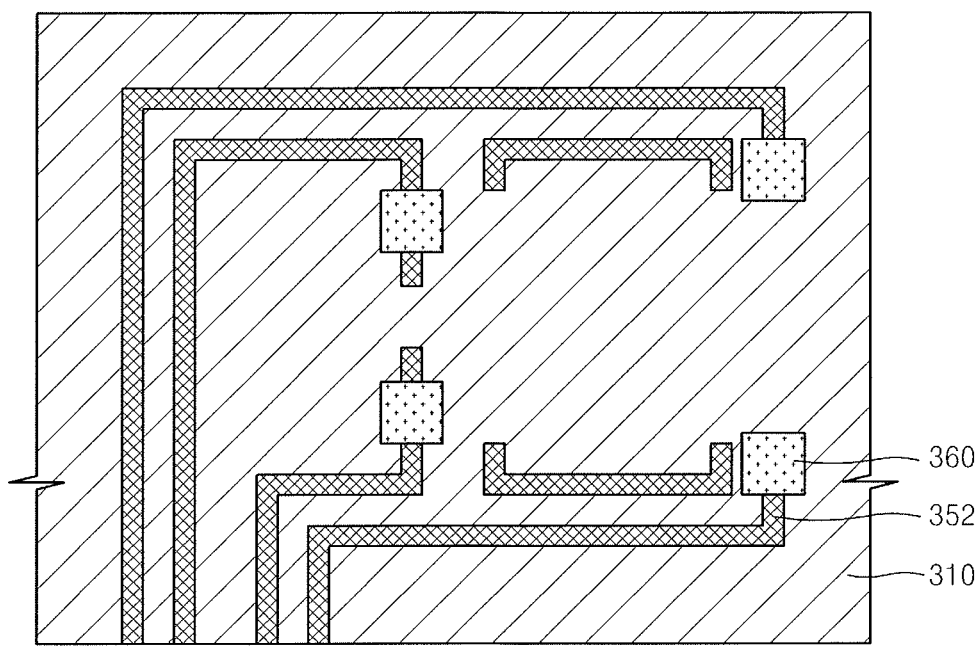

Referring to FIG. 7E, the pad mask patterns 360 each having a desired size may be formed at positions where pads are to be formed. As illustrated in FIG. 7E, the distance between the pad mask patterns 360 may be increased much more than the distance between the two parallel micropatterns.

Figure 7F:
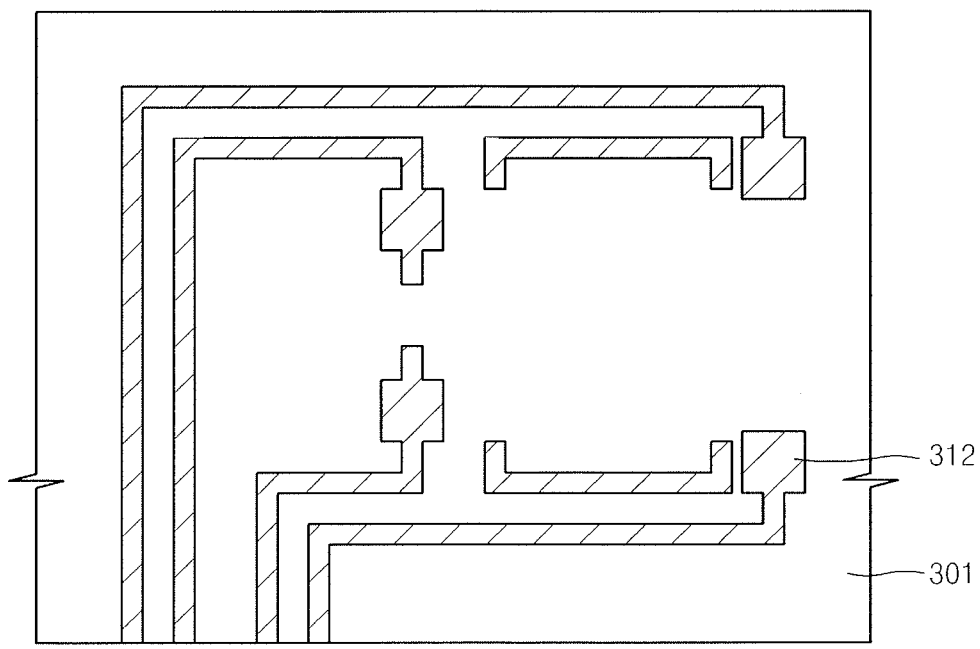

Referring to FIG. 7F, the target pattern 312 formed on the substrate 301 may be obtained by etching the etch target layer 310 using the second spacer mask 352 and the pad mask pattern 360 as an etch mask.

FIGS. 8A-8F are plan views illustrating a method of forming separated micropatterns according to another exemplary embodiment of the present inventive concept. A stack structure illustrated in FIGS. 8A-8F may be the same as that illustrated in FIGS. 3A-3I. Accordingly, detailed descriptions of the respective material layers constituting the stack structure and a method of forming the same will be omitted herein.

Figure 8A:
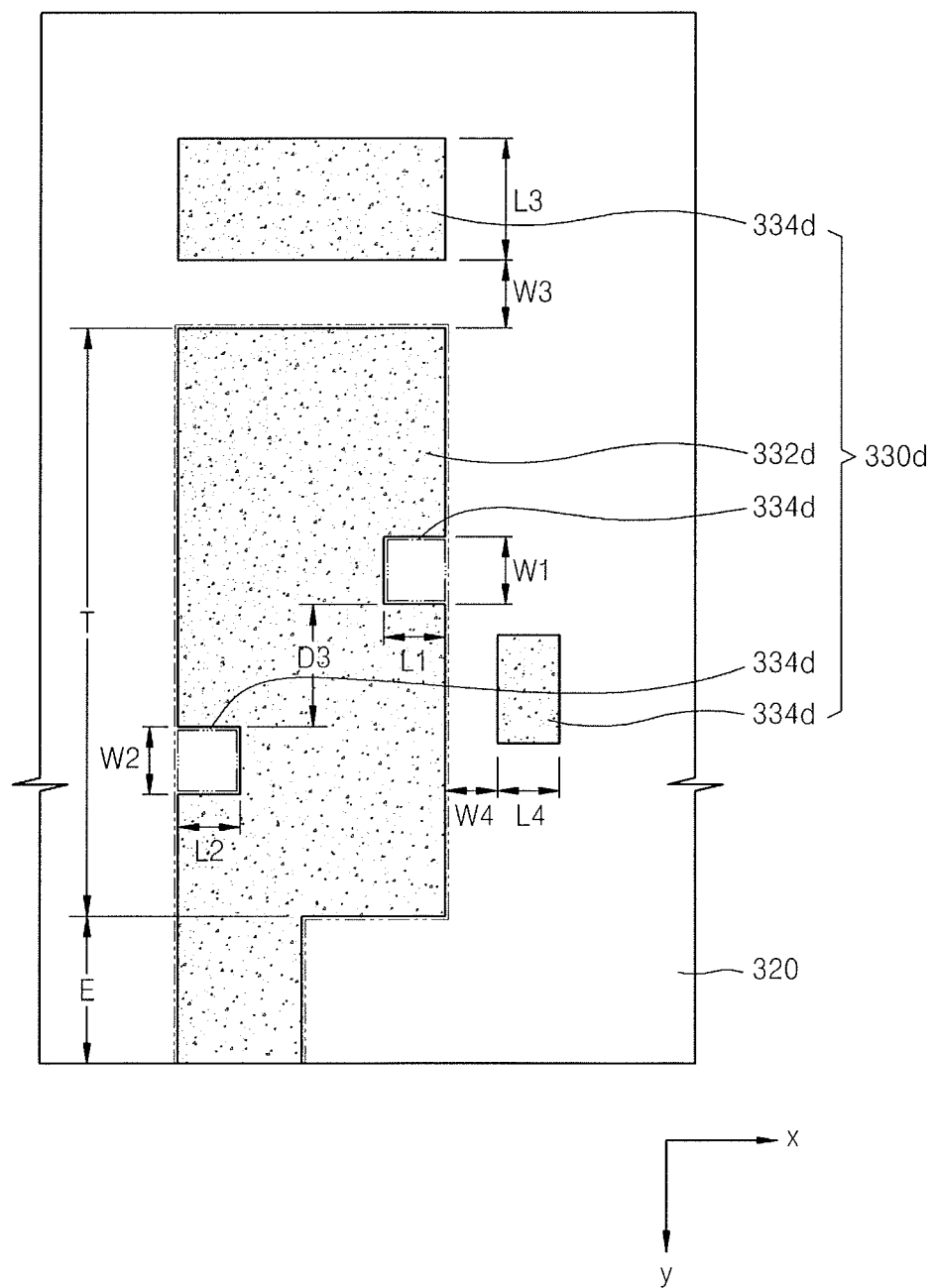

Referring to FIG. 8A, a first mold pattern 330d may be formed on the first material layer 320. The first mold pattern 330d may include a main pattern 332d and a plurality of separation-assist patterns 334d.

The main pattern 332d may include the extension portion E extending in the first direction indicated as the y direction and an end portion T having a width larger than that of the extension portion E. The extension portion E and the end portion T may be directly connected to each other as illustrated in FIG. 8A.

Also, as illustrated in FIG. 8A, the separation-assist patterns 334d may include recess patterns on the end portion T, e.g., as described previously with reference to recess pattern 334 in FIG. 4A, and auxiliary patterns adjacent to the main pattern 322d, in particular, to the end portion T, e.g., as described previously with reference to recess pattern 334a in FIG. 5A. The recess patterns may respectively have predetermined lengths $L_1$ and $L_2$ and predetermined widths $W_1$ and $W_2$. The auxiliary patterns may respectively have predetermined lengths $L_3$ and $L_4$ and predetermined widths $W_3$ and $W_4$ that are distanced from the main pattern 332d.

In particular, the recess patterns may be separated from each other by a distance D3 greater than 5 F in the y direction. The widths $W_1$, $W_2$, $W_3$, and $W_4$ may have a size of about 1 F to about 3 F, based on the minimum feature size F. However, the present inventive concept is not limited thereto and each of the widths $W_1$, $W_2$, $W_3$, and $W_4$ may have a larger size than the above size. The widths $W_1$, $W_2$, $W_3$, and $W_4$ may be determined considering the width of the first spacer mask 342 that will be formed later. That is, if the width of the first spacer mask 342 is large, the widths $W_1$, $W_2$, $W_3$, and $W_4$ may increase accordingly.

The lengths $L_1$, $L_2$, $L_3$, and $L_4$ of the recess patterns and the auxiliary patterns that are the separation-assist pattern 334d may be determined considering a degree of separation of separated micropatterns that will be formed later. That is, the lengths $L_1$, $L_2$, $L_3$, and $L_4$ may be selected in a range in which a misalignment margin with respect to another pattern may be sufficiently secured, which will be described later.

Figure 8B:
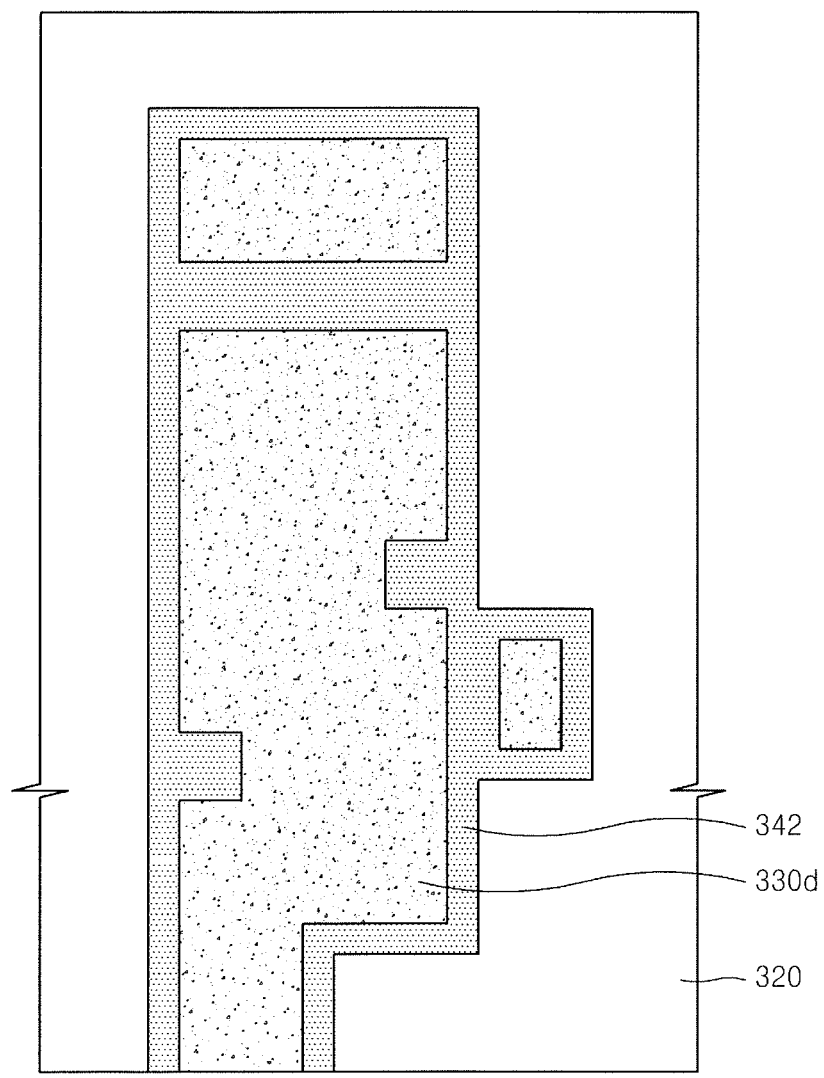

Referring to FIG. 8B, the first spacer mask 342 having a first width may be formed on a side wall of the first mold pattern 330d. The first spacer mask 342 may be formed by conformally forming a first spacer material layer (not shown) on an overall surface of the first material layer 320 and the first mold pattern 330 and performing an anisotropic etching of the first spacer material layer. Since this process is already described in detail with reference to FIG. 3C, an additional description thereof will be omitted herein.

The first spacer mask 342 may be formed to fill overall surfaces of the recess patterns with respect to the lengths $L_1$ and $L_2$ and the widths $W_1$ and $W_2$ of the recess patterns. However, there is no need for the first spacer mask 342 to completely fill the recess patterns with respect to the depth of FIG. 4B. Also, the first spacer mask 342 may be formed to fill an overall gap between the main pattern 332d and the auxiliary patterns with respect to the widths $W_3$ and $W_4$ between the first spacer mask 342 and the auxiliary patterns.

Figure 8C:
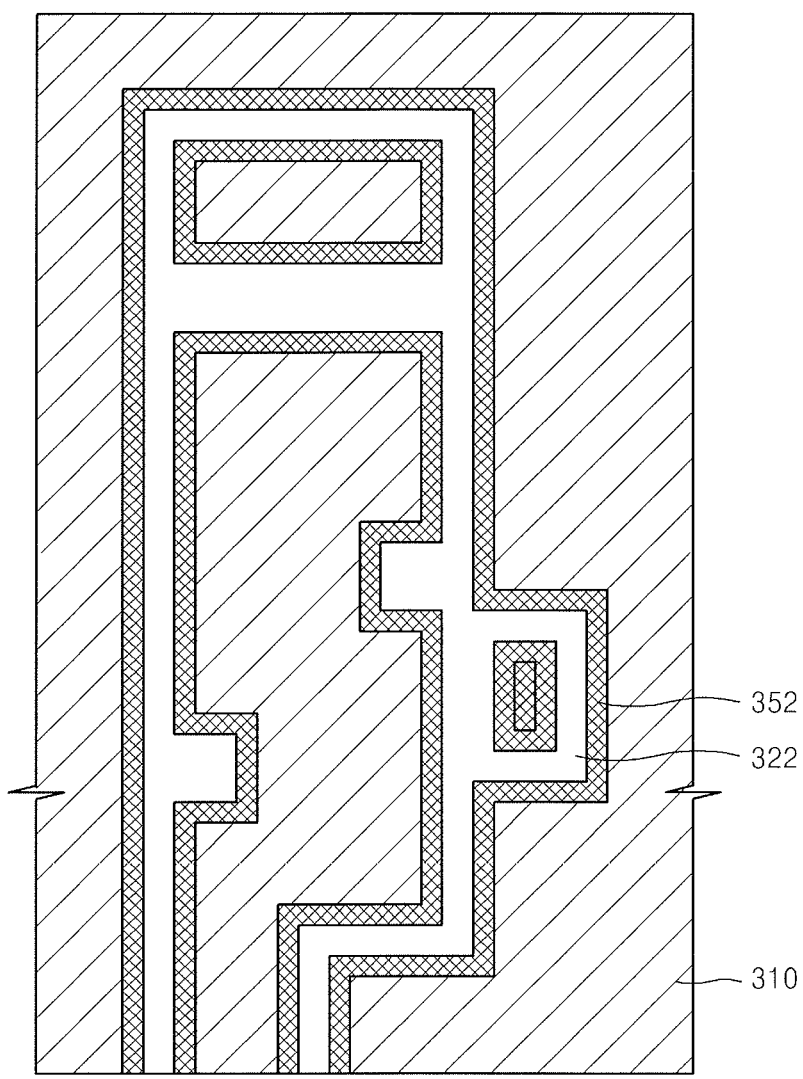

Referring to FIG. 8C, after the first mold pattern 330d is removed, the first material layer 320 may be anisotropically etched using the first spacer mask 342 as an etch mask. As a result, the second mold pattern 322 may be obtained. Then, the second spacer mask 352 may be formed on a side wall of the second mold pattern 322. Accordingly, since this process is already described in detail in the description with reference to FIGS. 4C and 5C, a detailed description thereof will be omitted herein.

Figure 8D:
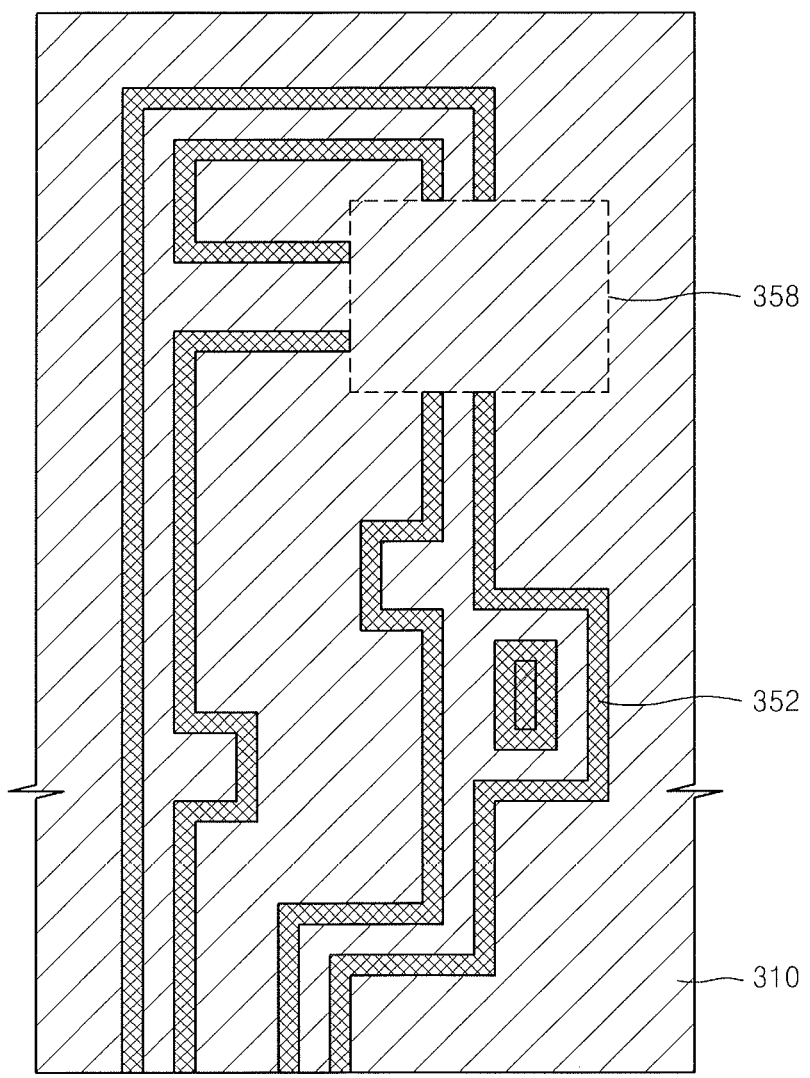

Referring to FIG. 8D, the second mold pattern 322 is removed. When the material used for the second mold pattern 322 is SOH, the second mold pattern 322 may be easily removed by ashing in an oxidation atmosphere. Then, the second spacer mask 352 is appropriately trimmed to separate the second spacer mask 352 from one another using an etch mask (not shown) exposing the trimming area 358. For example, a portion derived from the separation-assist patterns and a portion derived from the main pattern 332d may be trimmed simultaneously. Alternatively, only the portion derived from the separation-assist patterns may be selectively trimmed. Alternatively, only the portion derived from the main pattern 332d may be trimmed. Since the trimming method is described above with reference to FIGS. 4D and 5D, a detailed description thereof will be omitted herein.

Figure 8E:
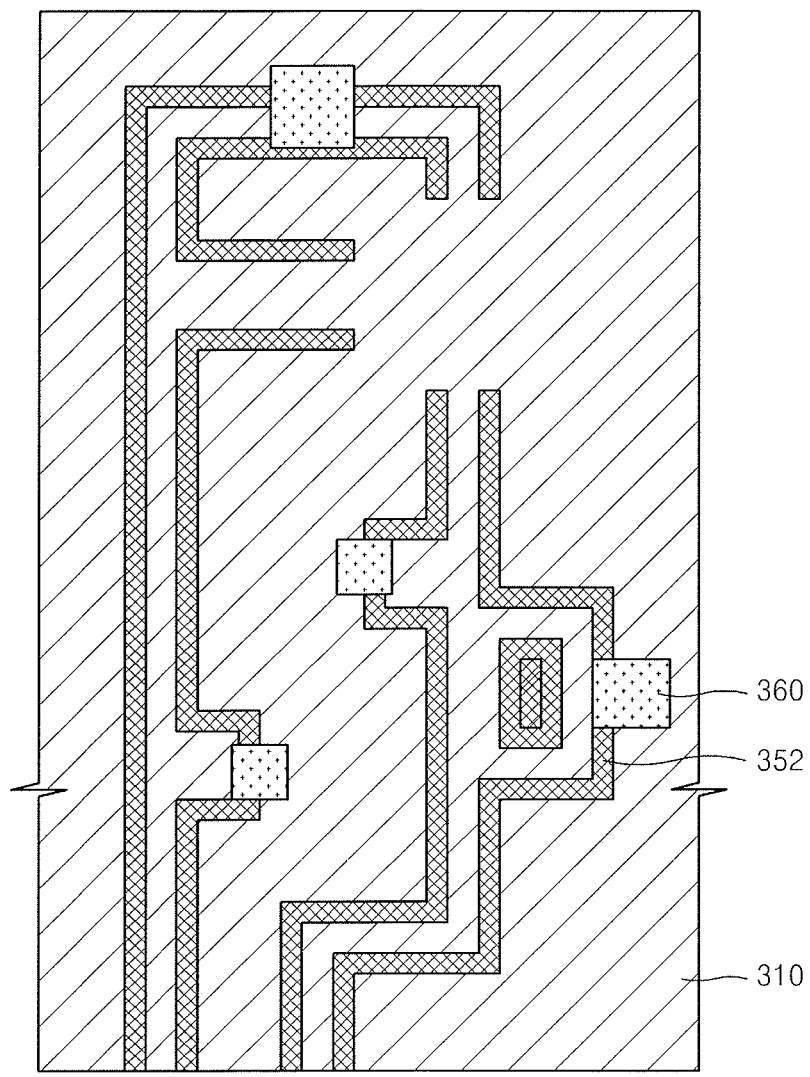

Referring to FIG. 8E, the pad mask patterns 360 each having a desired size may be formed at positions where pads are to be formed. Since the method of forming the pad mask pattern 360 is described above with reference to FIGS. 4E and 5E, a detailed description thereof will be omitted herein.

As illustrated in FIG. 8E, at each pad mask pattern 360, it can be seen that the distance between a pad mask pattern 360 and a micropattern extending parallel to the second spacer mask 352 in contact with the pad mask pattern 360 increases much. In other words, a misalignment margin with respect to the position of the pad mask pattern 360 increases. The misalignment margin is related to the lengths $L_1$, $L_2$, $L_3$, and $L_4$ of FIG. 8A that may be determined considering the required misalignment margin.

Figure 8F:
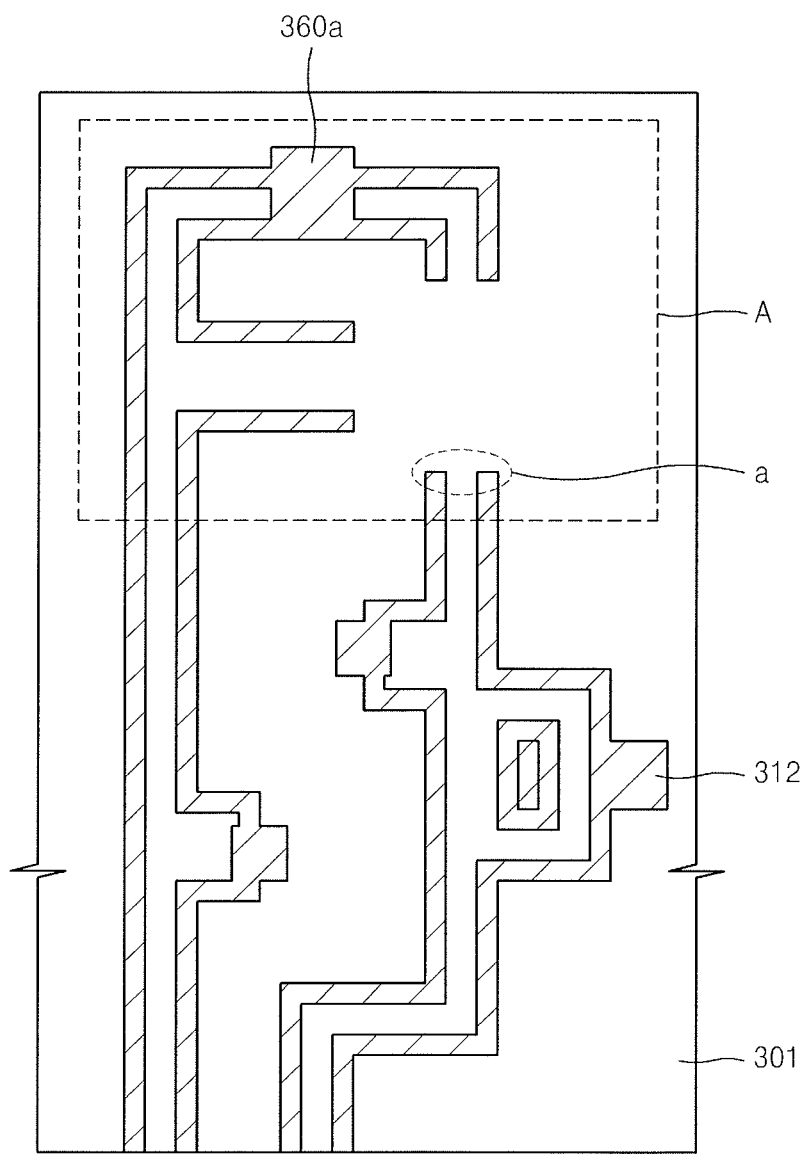

Referring to FIG. 8F, the target pattern 312 formed on the substrate 301 may be obtained by etching the etch target layer 310 using the second spacer mask 352 and the pad mask pattern 360 as an etch mask.

As described above, since the separation-assist patterns are appropriately included in the first mold pattern 330d, the micropatterns derived from the separation-assist patterns may be separated from each other by a distance over the misalignment margin of the pad mask pattern 360. Also, in forming ultra-micropatterns using the QPT, the pad mask pattern 360 may be formed relatively easily and reliably.

In forming the ultra-micropatterns, an influence by a loading effect or a reverse loading effect may be considered. In FIG. 8F, end portions of two micropatterns extending parallel to each other may contact each other due to a reverse loading effect when a pattern density nearby is too low. In particular, the reverse loading effect may be highly likely to be generated at a trimming portion in FIG. 8F. For example, the reverse loading effect may be highly likely to be generated in a portion "a" of FIG. 8F.

Figure 9:
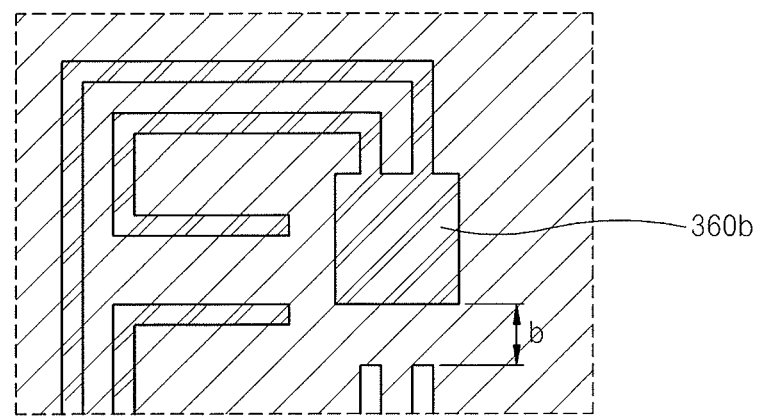
FIG. 9 illustrates a plan view of a portion of a pad arrangement according to another exemplary embodiment of the present inventive concept.

FIG. 9 is a plan view illustrating a portion of pad arrangement according to another exemplary embodiment of the present inventive concept. FIG. 9 may correspond to the portion "A" of FIG. 8F.

Referring to FIG. 9, when the position of the pad 360a of FIG. 8F is changed so as to be located at the end portions of the two micropatterns extending parallel to each other (refer to a pad 360b), the separation between the end portions located adjacent to the pad 360b may be improved. A distance "b" between the pad 360b and the end portions of the two micropatterns may be about 30 nm to about 70 nm.

Figure 10:
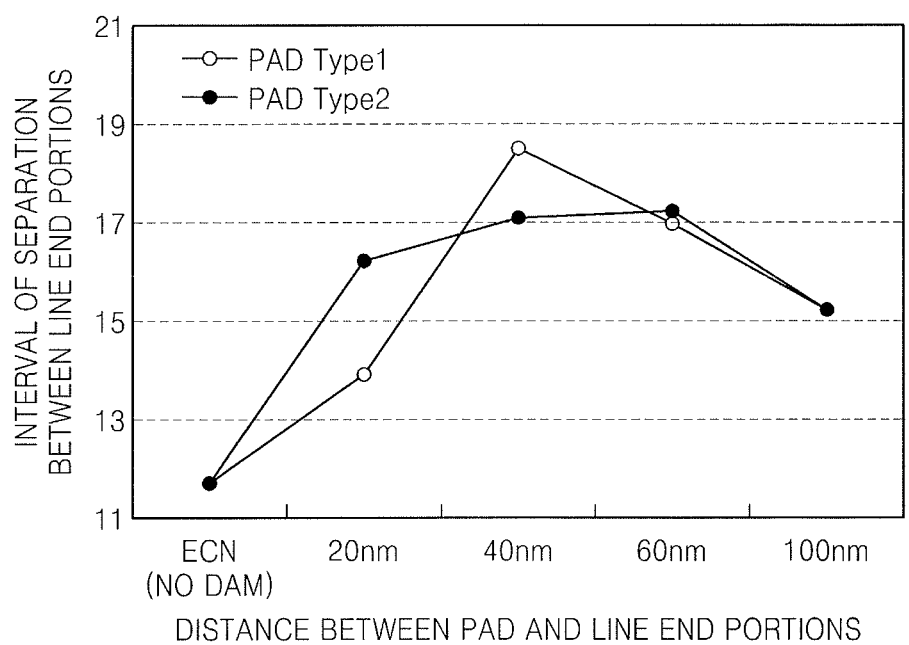
FIG. 10 illustrates a graph of an effect according to the pad arrangement of FIG. 9.

FIG. 10 is a graph showing a degree of separation between the neighboring end portions according to the distance between the pad and the end portions of the two micropatterns adjacent thereto. The graph of FIG. 10 is prepared according to two types of pads: Pad Type 1 is a rectangular pad and Pad Type 2 is an L-shaped pad including a portion extending from a rectangle toward the neighboring end portion.

As illustrated in FIG. 10, the interval of separation between the end portions of the two micropatterns is most properly guaranteed when the distance between the pad and the end portions adjacent to the pad is about 30 nm to about 70 nm.

Figure 11:
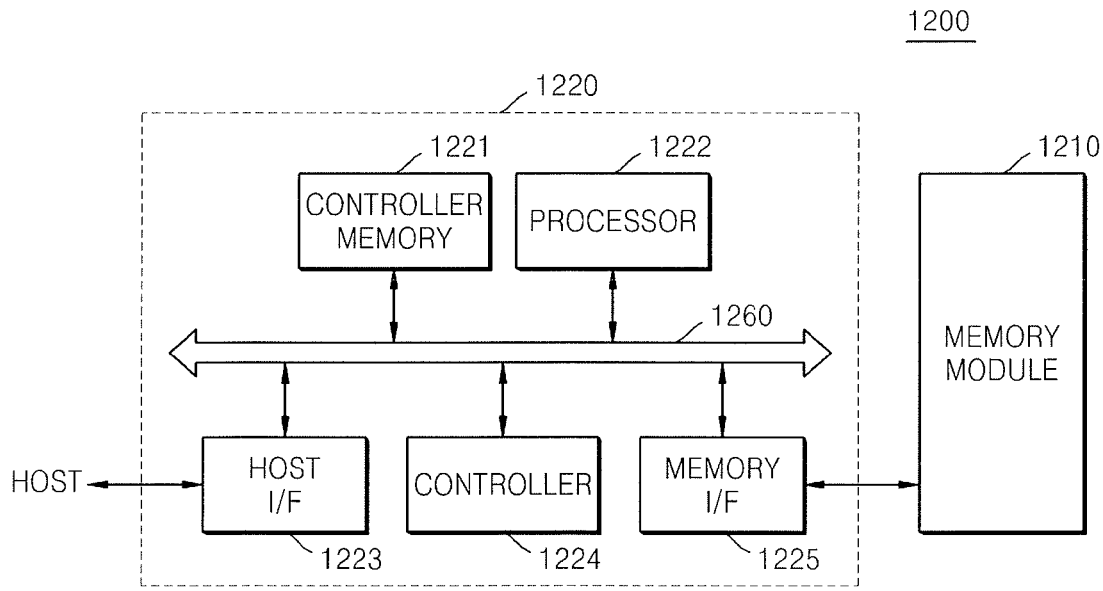
FIG. 11 illustrates a block diagram of a memory card including a semiconductor device, according to an exemplary embodiment of the present inventive concept.

FIG. 11 is a block diagram of a memory card 1200 including a semiconductor device, according to an exemplary embodiment of the present inventive concept. Referring to FIG. 11, the memory card 1200 includes a memory controller 1220 for generating commands and address signals C/A and a memory module 1210 that may be a flash memory including, for example, one or a plurality of flash memory devices. The memory controller 1220 includes a host interface 1223 for transmitting commands and address signals to a host or receiving these signals from the host, and a memory interface 1225 for transmitting the memory module 1210 the commands and address signals or receiving theses signals from the memory module 1210. The host interface 1223, the controller 1224, and the memory interface 1225 communicate with a controller memory 1221 such as an SRAM and a processor 1222 such as a CPU, via a common bus 1260.

The memory module 1210 receives commands and address signals from the memory controller 1220, stores data at least one of the memory devices on the memory module 1210 as a response, and searches data from at least one of the memory devices. Each memory device includes a plurality of addressable memory cells and a decoder for receiving commands and address signals and generating a column signal and a row signal to access at least one of the addressable memory cells during programming and reading operations.

Each of constituent parts of the memory card 1200 including the memory controller 1220, electronic devices 1221, 1222, 1223, 1224, and 1225 included in the memory controller 1220, and the memory module 1210 may include the micropatterns formed by using the processes according to the above-described exemplary embodiments of the present inventive concept.

Figure 12:
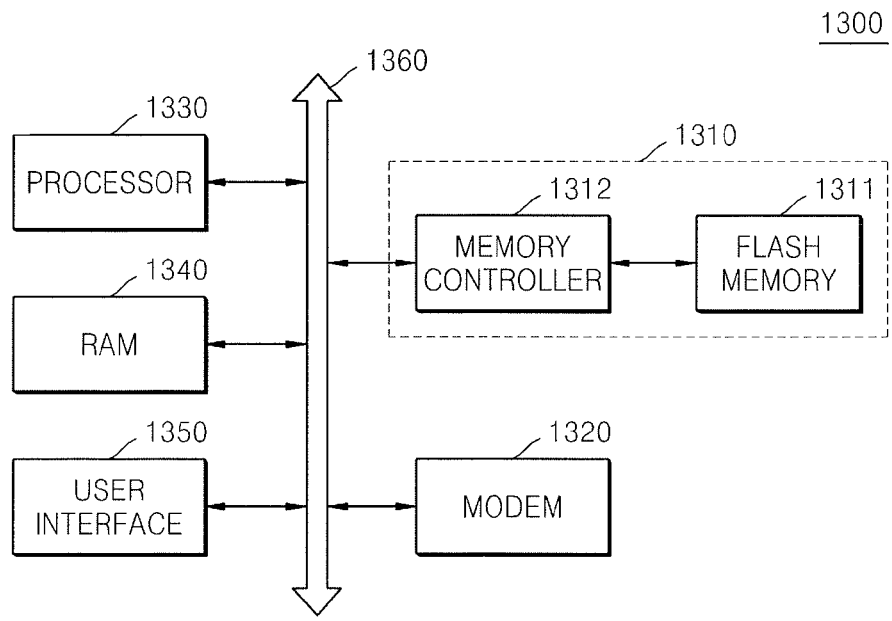
FIG. 12 illustrates a block diagram of a system with a memory card including a semiconductor device, according to an exemplary embodiment of the present inventive concept.

FIG. 12 is a block diagram of a memory system 1300 adopting a memory card 1310 having a semiconductor device, according to an exemplary embodiment of the present inventive concept. Referring to FIG. 12, the memory system 1300 includes a processor 1330 such as a CPU, a random access memory (RAM) 1340, a user interface 1350, and a modem 1320, which communicate via a common bus 1360. Each device transmits a signal to the memory card 1310 and receives a signal from the memory card 1310, via the bus 1360. Each constituent part of the memory system 1300 including the processor 1330, the RAM 1340, the user interface 1350, and the modem 1320, with the memory card 1310, may include the micropatterns formed by using the processes according to the above-described exemplary embodiments of the present inventive concept. The memory system 1300 may be applied to a variety of applied fields of electronics, for example, solid state drives (SSDs), CMOS image sensors (CISs), and computer application chip sets.

The memory systems and devices disclosed in the present specifications may be packaged in the form of one of various device package forms including a ball grid array (BGA), a chip scale package (CSP), a plastic leaded chip carrier (PLCC), a plastic dual in-line package (PDIP), a multi-chip package (MCP), a wafer-level fabricated package (WFP), a wafer-level processed stock package (WSP), etc. However, the present inventive concept is not limited thereto.

As described above, in the method of forming micropatterns according to the present inventive concept, a sufficient misalignment margin in relation to the formation of a pad may be secured even for extremely fine patterns. Also, contact between parallel wirings may be reduced due to a reverse loading effect.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming micropatterns separated over a misalignment margin, the method comprising:
   forming a first mold pattern, the first mold pattern including a main pattern and a separation-assist pattern, wherein forming the first mold pattern includes:
      forming the separation-assist pattern to have a form of a recess pattern in the main pattern; and
      forming the main pattern to include an extension portion extending in a first direction and an end portion connected to the extension portion, the end portion having a width larger than the extension portion, and the recess pattern being formed at the end portion;
   forming a first spacer mask having a first width around the first mold pattern;
   forming a second mold pattern using the first spacer mask as an etch mask;
   forming a second spacer mask having a second width around the second mold pattern; and
   forming a target pattern using the second spacer mask as an etch mask.

2. The method as claimed in claim 1, wherein forming the first mold pattern includes forming the recess pattern to have a width of about 1 F to about 3 F, where F is a minimum feature size.

3. The method as claimed in claim 1, wherein forming the first mold pattern includes forming the separation-assist pattern to have at least two recess patterns, an interval between the recess patterns being greater than or equal to 5 F.

4. The method as claimed in claim 1, further comprising trimming a portion of the second spacer mask before forming the target pattern.

5. The method as claimed in claim 4, wherein trimming the portion of the second spacer mask includes trimming a portion of a second spacer mask derived from the separation-assist pattern.

6. The method as claimed in claim 4, further comprising forming a pad mask pattern that at least partially overlaps the second spacer mask, at least one of trimmed end portions of the second spacer mask being disposed at a distance of about 30 nm to about 70 nm from the pad mask pattern.

7. The method as claimed in claim 1, wherein forming the first mold pattern includes forming the recess pattern to have a form of a cavity pattern in the main pattern, wherein an entire perimeter of the cavity pattern is surrounded by the end portion.

8. A method of forming micropatterns separated over a misalignment margin, the method comprising:
   forming a first mold pattern, the first mold pattern including a main pattern and a separation-assist pattern, wherein forming the first mold pattern includes forming the separation-assist pattern to have a form of an auxiliary pattern adjacent to the main pattern;
   forming a first spacer mask having a first width around the first mold pattern;
   forming a second mold pattern using only the first spacer mask as an etch mask, the second mold pattern thereby inheriting the pattern of the first spacer mask;
   forming a second spacer mask having a second width around only the second mold pattern; and
   forming a target pattern using the second spacer mask as an etch mask.

9. The method as claimed in claim 8, wherein forming the first mold pattern includes forming an interval between the main pattern and the auxiliary pattern to be about 1 F to about 3 F, where F is a minimum feature size.

10. The method as claimed in claim 8, wherein forming the first mold pattern includes forming the main pattern to include an extension portion extending in a first direction and an end portion having a width larger than the extension portion, the auxiliary pattern being formed adjacent to the end portion.

11. The method as claimed in claim 8, further comprising trimming a portion of the second spacer mask, a trimmed length of the second spacer mask derived from the separation-assist pattern being different from a trimmed length of the second spacer mask derived from the main pattern.

12. The method as claimed in claim 11, wherein a distance between a trimmed end portion of the second spacer mask derived from the separation-assist pattern and a trimmed end portion of the second spacer mask derived from the main pattern is greater than or equal to 5 F.

13. A method of forming micropatterns separated over a misalignment margin, the method comprising:
   forming a first mold pattern on a first material layer, the first mold pattern including a main pattern and a separation-assist pattern, and the separation-assist pattern being positioned to expose a space on the first material layer adjacent to the main pattern;
   forming a first spacer mask having a first width around the first mold pattern;
   forming a second mold pattern using only the first spacer mask as an etch mask, the second mold pattern thereby inheriting the pattern of the first spacer mask;
   forming a second spacer mask having a second width around only the second mold pattern; and
   forming a target pattern using the second spacer mask as an etch mask.

14. The method as claimed in claim 13, further comprising trimming a portion of the second spacer mask before forming the target pattern, such that the second spacer mask includes a plurality of separated micropatterns.

15. The method as claimed in claim 14, further comprising forming a pad mask pattern connected to one of the plurality of micropattern, the pad being positioned adjacent to the exposed space defined by the separation-assist pattern.

16. The method as claimed in claim 14, wherein forming the exposed space defined by the separation-assist pattern defines a space between two adjacent micropatterns.

17. The method as claimed in claim 13, wherein:
   forming the first spacer mask around the first mold pattern includes forming the first spacer mask on all sidewalls of the first mold pattern;
   forming the second mold pattern includes removing the first material layer, with the exception of material directly below the first spacer mask; and
   forming the second spacer mask around the second mold pattern includes forming the second spacer mask on all sidewalls of the second mold pattern, the second mold pattern having a shape of the first spacer mask.

18. A method of forming micropatterns separated over a misalignment margin, the method comprising:
   forming a first material layer on an etch target layer, where a target pattern is to be formed;
   forming a first mold pattern on the first material layer, the first mold pattern including a main pattern and a separation-assist pattern, the separation-assist pattern having a form of:
      an auxiliary pattern adjacent to the main pattern; or
      a recess pattern in the main pattern, wherein:

the main pattern includes an extension portion in a first direction and an end portion connected to the extension portion, the end portion has a width larger than the extension portion, and the recess pattern is formed at the end portion;

forming a first spacer mask having a first width on a sidewall of the first mold pattern;

removing the first mold pattern;

etching the first material layer using only the first spacer mask as an etch mask to form a second mold pattern, the second mold pattern thereby inheriting the pattern of the first spacer mask;

forming a second spacer mask only on a sidewall of the second mold pattern;

removing the second mold pattern; and etching the etch target layer using the second spacer mask as an etch mask, to form a target pattern.

* * * * *